(12) United States Patent
Jeon et al.

(10) Patent No.: US 7,351,636 B2
(45) Date of Patent: Apr. 1, 2008

(54) METHODS OF FORMING SPLIT-GATE NON-VOLATILE MEMORY CELLS INCLUDING RAISED OXIDE LAYERS ON FIELD OXIDE REGIONS

(75) Inventors: Hee-Seog Jeon, Gyeonggi (KR); Seung-Beom Yoon, Gyeonggi-do (KR); Jeong-Uk Han, Gyeonggi-do (KR); Yong-Tae Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 245 days.

(21) Appl. No.: 11/138,702

(22) Filed: May 26, 2005

(65) Prior Publication Data
US 2006/0008984 A1 Jan. 12, 2006

(30) Foreign Application Priority Data
Jul. 12, 2004 (KR) .................. 10-2004-0054050

(51) Int. Cl.
*H01L 21/336* (2006.01)
(52) U.S. Cl. ...................... 438/257; 257/314
(58) Field of Classification Search ........ 438/257–259, 438/265–267, 593–596, 304; 257/314–317, 257/E21.682, E27.103
See application file for complete search history.

(56) References Cited

U.S. PATENT DOCUMENTS

| 4,328,565 A | 5/1982 | Harari |
| 4,616,340 A | 10/1986 | Hayashi et al. |
| 4,783,766 A | 11/1988 | Samachisa et al. |
| 5,291,439 A | 3/1994 | Kauffmann et al. |
| 5,317,179 A | 5/1994 | Chen et al. |
| 5,341,342 A | 8/1994 | Brahmbhatt |
| 5,373,465 A | 12/1994 | Chen et al. |
| 5,939,749 A | 8/1999 | Taketa et al. |
| 6,204,126 B1 * | 3/2001 | Hsieh et al. .................. 438/267 |
| 6,727,545 B2 | 4/2004 | Wang et al. |
| 2002/0093044 A1 | 7/2002 | Hsieh et al. |

FOREIGN PATENT DOCUMENTS

| KR | 10-2002-0045434 | 6/2002 |
| KR | 10-2004-0013529 | 2/2004 |

OTHER PUBLICATIONS

Notice to File a Response/Amendment to the Examination Report for Korean Patent Application No. 10-2004-0054050 mailed on Dec. 16, 2005.

\* cited by examiner

*Primary Examiner*—David Vu
(74) *Attorney, Agent, or Firm*—Myers Bigel Sibley & Sajovec, P.A.

(57) ABSTRACT

A method of forming a split-gate non-volatile memory cell can include forming first and second adjacent floating gates self-aligned to a field oxide region therebetween. An oxide layer is formed covering the first and second adjacent floating gates and the field oxide region, the oxide layer electrically isolates the first and second adjacent floating gates from one another. A control gate is formed on the oxide layer on the first and second adjacent floating gates. Related devices are also disclosed.

13 Claims, 27 Drawing Sheets

METHODS OF FORMING SPLIT-GATE NON-VOLATILE MEMORY CELLS INCLUDING RAISED OXIDE LAYERS ON FIELD OXIDE REGIONS

CROSS-REFERENCE TO RELATED APPLICATION

This application claims the priority of Korean Patent Application No. 2004-0054050, filed on Jul. 12, 2004, in the Korean Intellectual Property Office, the disclosure of which is hereby incorporated by reference in its entirety.

FIELD OF THE INVENTION

The invention relates generally to the field of semiconductors and more particularly to non-volatile semiconductor memory cells.

BACKGROUND

Non-volatile memory devices are used in a wide range of applications where a power supply may not always be available. For example, non-volatile memory devices are sometimes used to store data in cellular telephones, smart cards, and personal computers. One type of non-volatile memory device is referred to as a split-gate non-volatile memory an example of which is illustrated in FIG. 1. In operation, the split-gate memory cell can be programmed with data by transferring charge to a floating gate 6 using hot carrier injection as indicated by arrow 1 in FIG. 1. The split-gate memory cell can be erased by discharging the stored charge from the floating gate 6 via a control gate 5 as indicated by arrow 2. Once the split-gate memory cell is programmed or erased as desired, the data stored in the split-gate memory cell can be accessed by reading the split-gate memory cell.

As shown in FIG. 1, a conventional split-gate memory cell can be formed in conjunction with an opposing split-gate memory cell where both opposing split-gate memory cells are arranged in a common source configuration. In particular, a common source region 4 can be electrically coupled to separate opposing drain regions 3 via each of the opposing split-gate memory cells. In operation, the common source 4 can be electrically coupled to either of the drain regions 3 by applying the appropriate voltages to the respective floating gate 6 and control gate 5 included in each of the opposing split-gate memory cells.

It is known that split-gate memory cells provide several advantages over other types of non-volatile memories, such as low programming current, low interference, as well as high speed. Split-gate memory cells can also carry several disadvantages such as relatively large size compared to other types of non-volatile memory cells.

It is also known that if the distance (D1 and D2) that the control gate overlaps the active area excessively varies from cell-to-cell, the amount of current generated in the different memory cells may vary enough that memory cells may not operate predictably. The following references discuss several types of split-gate memory cells as well as different approaches to the formation thereof: U.S. Pat. No. 4,328,565, U.S. Pat. No. 4,616,340, U.S. Pat. No. 4,783,766, U.S. Pat. No. 5,291,439, U.S. Pat. No. 5,317,179, U.S. Pat. No. 5,341,342, U.S. Pat. No. 5,373,465, 2000-75049 (Korea File: December, 2000: SEC B), and U.S. Pat. No. 6,727,545.

Notwithstanding the various approaches discussed above and in the listed references, there remains a need for improvement in the formation of split-gate memory cells and related devices.

SUMMARY

Embodiments according to the invention can provide methods of forming split-gate non-volatile memory cells including raised oxide layers on field oxide regions and split-gate non-volatile memory cells so formed. Pursuant to these embodiments, a method of forming a split-gate non-volatile memory cell can include forming first and second adjacent floating gates self-aligned to a field oxide region therebetween. An oxide layer is formed covering the first and second adjacent floating gates and the field oxide region, the oxide layer electrically isolates the first and second adjacent floating gates from one another. A control gate is formed on the oxide layer on the first and second adjacent floating gates.

In some embodiments according to the invention, forming the first and second adjacent floating gates includes forming a conductive layer on respective active regions in a substrate adjacent to the field oxide region and avoiding forming the conductive layer on the field oxide region. In some embodiments according to the invention, the method further includes forming a second conductive layer on the first conductive layer and on the field oxide region.

In some embodiments according to the invention, the split-gate non-volatile memory cell is included in a common source/drain configuration with another split-gate non-volatile memory cell and the method further includes forming a recess to provide access to the substrate between the split-gate non-volatile memory cells for doping of the substrate to form a common source/drain region in the substrate. A spacer is formed on a sidewall of the recess defined by portions of the first and second conductive layers to electrically isolate the first and second conductive layers from a contact formed in the recess on the spacer.

In some embodiments according to the invention, forming the oxide layer includes oxidizing the second conductive layer on the first conductive layer and oxidizing the second conductive layer on the field oxide region. In some embodiments according to the invention, oxidizing the second conductive layer on the first conductive layer includes oxidizing a portion of the second conductive layer on the first conductive layer exposed in a gap defined by a sacrificial structure above the portion and by the first conductive layer below the portion.

In some embodiments according to the invention, oxidizing includes oxidizing a full thickness of the portion of the second conductive layer and a partial thickness of a portion of the first conductive layer to form the oxide layer on the first conductive layer that fills the gap. In some embodiments according to the invention, the method further includes forming a sacrificial spacer on a side wall of the sacrificial structure, above the active regions, that covers an exposed portion of the oxide layer in the gap.

In some embodiments according to the invention, oxidizing the second conductive layer on the field oxide region includes oxidizing a portion of the second conductive layer on the field oxide region exposed in a gap defined by a sacrificial structure above the portion and by the field oxide region below the portion. In some embodiments according to the invention, the method further includes forming a sacrificial spacer on a side wall of the sacrificial structure, above the field oxide region, that covers an exposed portion of the extended oxide layer that fills the gap.

In some embodiments according to the invention, oxidizing includes oxidizing a full thickness of the portion of the second conductive layer to form an extended oxide layer on the field oxide region extending onto the first and second active regions, the extended oxide layer on the field oxide region partially filling the gap.

In some embodiments according to the invention, the extended oxide layer includes a raised surface that is higher than a surface of the oxidized second conductive layer on the first conductive layer. In some embodiments according to the invention, forming a control gate on the oxide layer further includes forming an extended control gate portion of the control gate in the gap on the extended oxide layer. In some embodiments according to the invention, further includes oxidizing the conductive layer on the active region and oxidizing the conductive layer on the field oxide region. In some embodiments according to the invention, the conductive layer comprises polysilicon.

In some embodiments according to the invention, a method of forming a split-gate non-volatile memory cell includes forming a blanket oxide layer on field oxide regions and on active regions between adjacent field oxide regions to cover floating gates formed self-aligned to the field oxide regions.

In some embodiments according to the invention, the method further includes forming control gates on the oxide layer over respective self-aligned floating gates. In some embodiments according to the invention, a method of forming a split-gate non-volatile memory cell includes patterning a substrate having an oxide thereon to form raised field oxide regions therein and to form active regions between the field oxide regions at a lower level than the field oxide regions. A single conductive layer is formed on the active regions and on the raised field oxide regions. A first sacrificial layer is formed on the single conductive layer. The first sacrificial layer is patterned to open a recess therein that exposes the single conductive layer. A second sacrificial layer is formed in the recess and on the exposed single conductive layer. An inner spacer is formed on a side wall of the second sacrificial layer in the recess. The recess is etched to remove the exposed single conductive layer therein to expose the oxide beneath. A pillar is formed in the recess to provide a T-shaped sacrificial structure including the inner spacer and the second sacrificial layer. The second sacrificial layer is removed to form a first gap above the active regions between a lower surface of the T-shaped sacrificial structure and an upper surface of the single conductive layer and to form a second gap above the field oxide regions between the lower surface of the T-shaped sacrificial structure and the upper surface of the single conductive layer on the field oxide regions. The upper surface of the single conductive layer exposed in the first and second gaps is oxidized to form an oxide layer on the active regions in the first gap and to form a raised oxide layer on the field oxide regions in the second gap that extends onto the active regions to meet with the oxide layer.

In some embodiments according to the invention, a method of forming a split-gate non-volatile memory cell includes patterning a substrate having an oxide thereon to form raised field oxide regions therein and to form active regions between the field oxide regions at a lower level than the field oxide regions. A first conductive layer is formed on the active regions. A second conductive layer is formed on the first conductive layer on the active regions and covering the field oxide regions. A first sacrificial layer is formed on the first and second conductive layers. The first sacrificial layer is patterned to open a recess therein that exposes the second conductive layer above the active regions and above the field oxide regions. A second sacrificial layer is formed in the recess and on the exposed second conductive layer. An inner spacer is formed on a side wall of the second sacrificial layer in the recess. The recess is etched to remove the exposed second conductive layer and the underlying first conductive layer therein to expose the oxide beneath. A pillar is formed in the recess to provide a T-shaped sacrificial structure including the inner spacer and the second sacrificial layer. The second sacrificial layer is removed to form a first gap above the active regions between a lower surface of the T-shaped sacrificial structure and an upper surface of the second conductive layer and to form a second gap above the field oxide regions between the lower surface of the T-shaped sacrificial structure and the upper surface of the first conductive layer on the field oxide regions. The upper surface of the second conductive layer exposed in the first and second gaps is oxidized to form an oxide layer on the active regions in the first gap and to form a raised oxide layer on the field oxide regions in the second gap that extends onto the active regions to meet with the oxide layer.

In some embodiments according to the invention, oxidizing includes oxidizing a full thickness of the second conductive layer and a partial thickness of the first conductive layer to fill the first gap with the oxide layer. A full thickness of the second conductive layer is oxidized to partially fill the second gap with the raised oxide layer that extends onto adjacent floating gates to meet the oxide layer thereon.

In some embodiments according to the invention, a split-gate non-volatile memory device includes a raised oxide layer on a field oxide region between adjacent split-gate memory cells, the raised oxide layer extending onto first and second floating gates included in the adjacent split-gate memory cells covered by a wordline electrically coupled to respective control gates included in the adjacent split-gate memory cells.

In some embodiments according to the invention, central upper portions of the first and second floating gates are lower than a surface of the field oxide region. In some embodiments according to the invention, the raised oxide layer is a thermally oxidized polysilicon layer. In some embodiments according to the invention, the floating gates are self aligned to the field oxide regions. In some embodiments according to the invention, the raised oxide layer extends onto the active region to cover the floating gates.

In some embodiments according to the invention, the raised oxide layer on the field oxide region is thinner than a portion of the raised oxide layer that extends onto the active region to cover the first and second floating gates. In some embodiments according to the invention, the device further includes a first spacer on a side wall of the control gates above the floating gates and a second spacer on side walls of the raised oxide layer and the floating gates.

In some embodiments according to the invention, a split-gate non-volatile memory device includes first and second adjacent floating gates self-aligned to a field oxide region therebetween. An oxide layer covers the first and second adjacent floating gates and the field oxide region, and the oxide layer electrically isolates the first and second adjacent floating gates from one another. A control gate is on the oxide layer on the first and second adjacent floating gates.

In some embodiments according to the invention, central upper portions of the first and second floating gates are lower than a surface of the field oxide region. In some embodiments according to the invention, the oxide layer is a thermally oxidized polysilicon layer. In some embodiments according to the invention, the oxide layer extends onto the active region to cover the floating gates. In some embodiments according to the invention, the oxide layer on the field oxide region is thinner than a portion of the oxide layer that extends onto the active region to cover the first and second floating gates. In some embodiments according to the invention, the device further includes a first spacer on a side wall of the control gates above the floating gates and a second spacer on side walls of the oxide layer and the floating gates.

BRIEF DESCRIPTION OF THE DRAWINGS

FIGS. 20A-20C through FIGS. 21A-21C are cross-sectional views illustrating the formation of split-gate memory cells according to further embodiments of the invention.

DESCRIPTION OF EMBODIMENTS ACCORDING TO THE INVENTION

Figure 1:
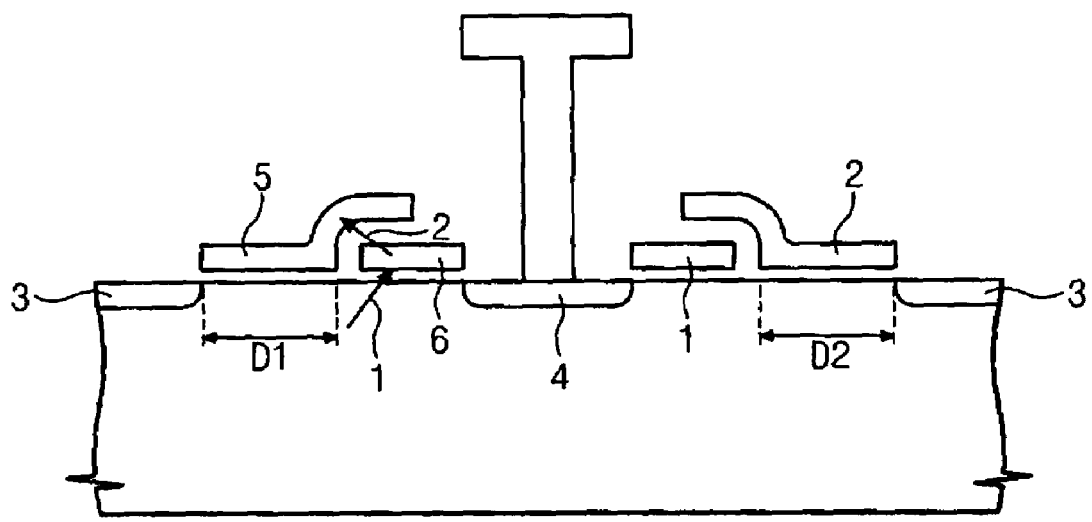
FIG. 1 is a cross-sectional view that illustrates a conventional split-gate memory cell in a common source configuration.

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "bottom", "upper", "top", "beneath", "above", and the like are used herein to describe one element's relationship to another elements as illustrated in the Figures. It will be understood that relative terms are intended to encompass different orientations of the subject in the figures in addition to the orientation depicted in the Figures. For example, if the subject in the Figures is turned over, elements described as being on the "lower" side of or "below" other elements would then be oriented on "upper" sides of (or "above") the other elements. The exemplary term "lower", can therefore, encompasses both an orientation of "lower" and "upper," depending of the particular orientation of the figure. Similarly, if the subject in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As described herein below in greater detail, in some embodiments according to the invention, an oxide layer can be formed to cover first and second adjacent floating gates and a field oxide region, wherein the oxide layer electrically isolates the first and second adjacent floating gates from one another. For example, the oxide layer can extend from on the active region above the floating gate onto the adjacent field oxide region. Furthermore, the portion of the oxide layer that extends onto the field oxide region can be raised relative to the oxide layer that is above the floating gate.

Accordingly, a surface of the raised oxide layer is at a higher level than a surface of the oxide layer located above the floating gate. Extending the oxide layer from on the floating gate to on the field oxide region (and further onto the floating gate in the adjacent memory cell) can electrically isolate the floating gates in the adjacent memory cells from one another. Furthermore, the floating gates can be formed self-aligned to the field oxide regions (and isolated from one another via the oxide layer including the raised oxide layer on the field oxide between adjacent split-gate memory cells). The oxide layer including the raised oxide layer on the field oxide region may improve the self-alignment of the floating gates in forming the split-gate memory cells according to some embodiments of the invention.

Figure 2:
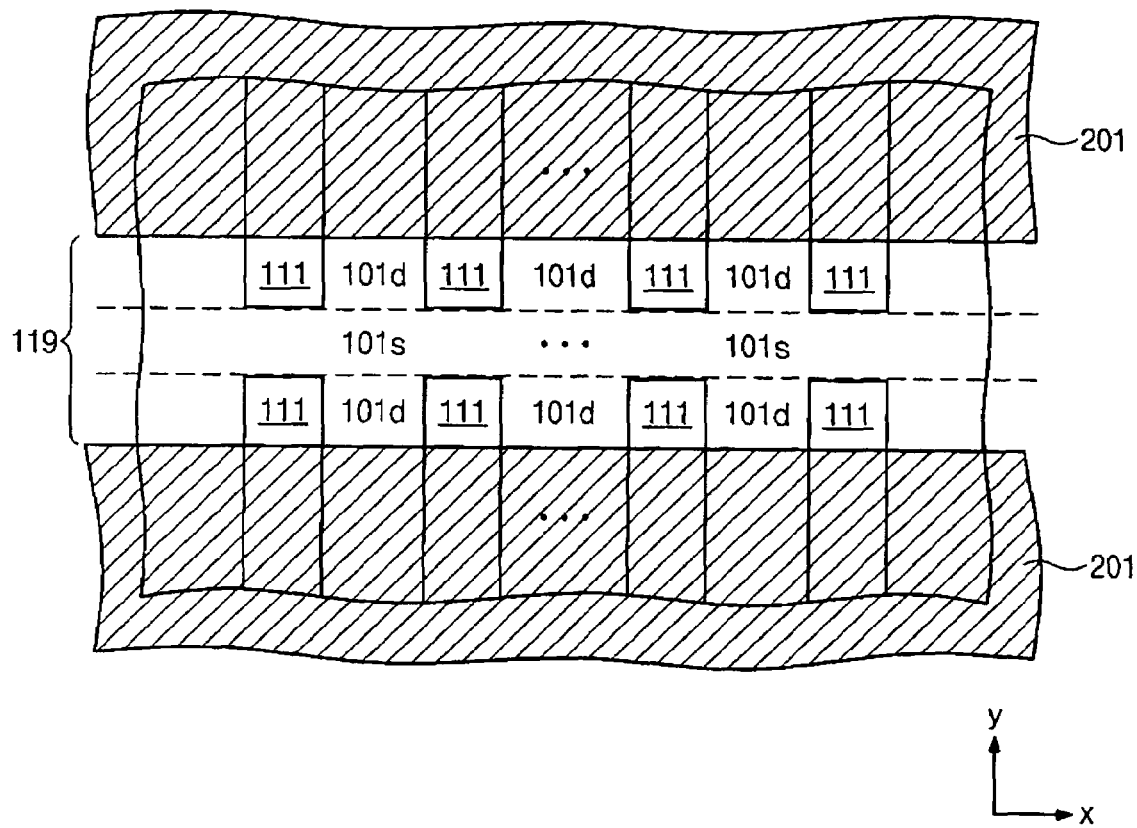
FIG. 2 is a top view of a substrate including pairs of opposing split-gate memory cells arranged between adjacent field oxide regions according to some embodiments of the invention.

FIG. 2 is a top view of a substrate including active regions 101$d$ and 101$s$. The active regions 101$d$ and 101$s$ correspond to regions where drains and sources are to be formed for split-gate memory cells according to some embodiments of the invention using a mask 102 including an opening 119. Opposing active regions 101$d$ correspond to respective drain regions associated with opposing split-gate memory cells to be formed thereon in the "y" direction are shown in FIG. 2. Furthermore, active region 101$s$ refers to a source region that provides a common source configuration for the opposing split-gate memory cells. The opposing split-gate memory cells are separated from adjacent opposing split-gate memory cells by field oxide regions 111 in the "x" direction are shown in FIG. 2.

Figure 3:
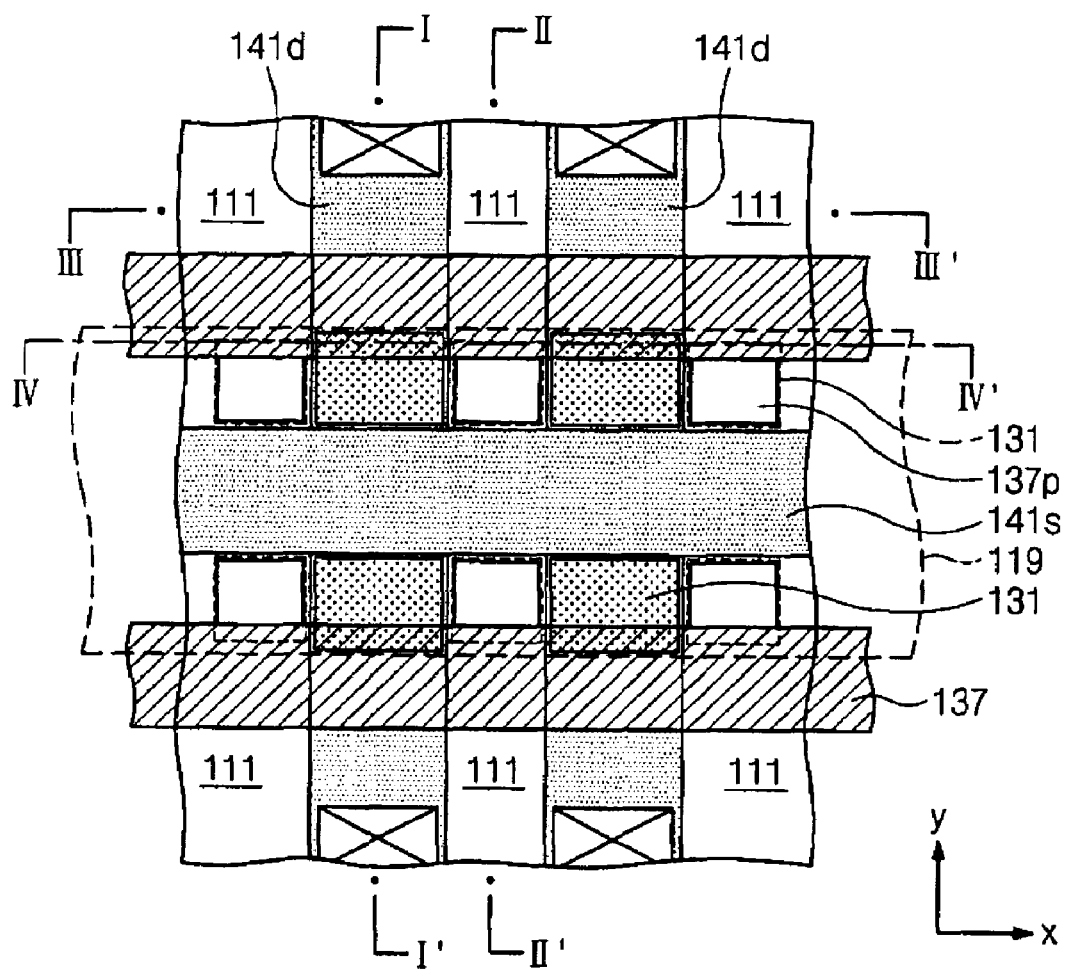
FIG. 3 is a top view of a substrate including split-gate memory cells according to some embodiments of the invention.

FIG. 3 is a top view of a substrate including a number of opposing split-gate memory cells that are separated from adjacent ones of the split-gate memory cells in the x direction by field oxide regions 111. Referring to FIG. 3, a source region 141$s$ extends in the x direction and is located between opposing split-gate memory cells arranged in the y direction to provide the common source configuration for the opposing split-gate memory cells when formed.

Each of the opposing split-gate memory cells includes a respective floating gate located between the field oxide regions 111 and partially over the common source region 141$s$. A remaining portion of the floating gate is formed over the portion of the active region that separates the respective drain region from the common source region 141$s$. An oxide layer 131 is on the floating gate between the field oxide regions 111. The oxide layer 131 extends from on the floating gate therebeneath onto the field oxide regions 111 in the x direction.

It will be understood that the portion of the oxide layer 131 that extends onto the field oxide region 111 is raised relative to the oxide layer 131 to a level above the floating gate. Moreover, the oxide layer extending onto the field oxide region 111 can continuously extend onto floating gates included in adjacent ones of the split-gate memory cells, and further, can extend onto the field oxide region 111 that separates that split-gate memory cell from its next adjacent neighbor in the x direction. Accordingly, the portion of the oxide layer that extends from on the floating gate onto the field oxide region 111 is referred to as a raised oxide layer 131' as shown in FIG. 3.

A control gate (or word line) 137 is on a portion of the active region that separates the common source region 141$s$ from the respective drain region 141$d$ and extends vertically adjacent to and above the oxide layer 131 and covers a portion of the oxide layer 131 over the floating gate. Furthermore, a portion of the control gate 137$p$ extends above the raised oxide layer 131' on the field oxide regions 111.

FIGS. 4A-C and FIG. 5 are cross-sectional views, taken along lines I-I', II-II', III-III', and IV-IV' respectively in FIG. 3, that illustrate split-gate memory cells according to some embodiments of the invention. Referring to FIGS. 4A-C and FIG. 5, respective drain regions 141$d$ in the substrate 101 are separated from a common source region 141$s$. An oxide layer 103 is on the substrate 101 and can electrically isolate the floating gate 131 and control gate 137 from the active regions of the substrate 101. The floating gate 133 partially covers a portion of the common source region 141 and portions of the substrate 101 separating the respective drain regions 141$d$ from the common source region 141$s$. The remaining portion of the substrate 101 that separates the respective drain regions 141$d$ from the common source region 141$s$ is covered by the control gate 137 thereon.

The control gate 137 extends vertically adjacent to a sidewall of the floating gate 131 and the oxide layer 131 located above the floating gate 133. Furthermore, the control gate 137 extends to cover a portion of the oxide layer 131. Spacer 135 electrically isolates the floating gate 133 from the adjacent portion of the control gate 137 that extends vertically along the sidewall thereof. Furthermore, spacer 143 can promote the formation of the respective drain regions 141$d$ and the common source region 141$s$ as well as provide electrical isolation of the floating gate 133 and control gate 137 from adjacent conductive structures such as plugs, etc. that can provide access to the respective drain regions 141$d$ and the common source region 141$s$.

Figure 4A:
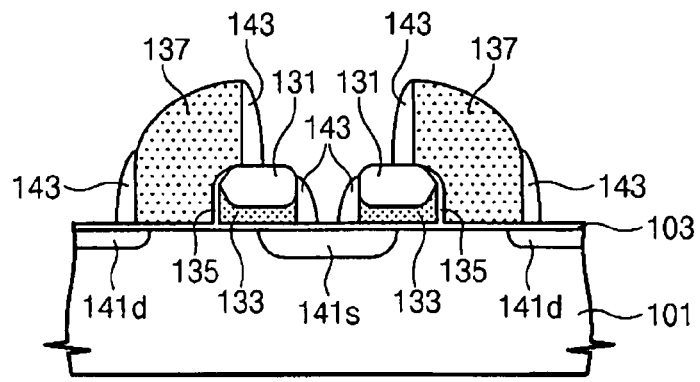
FIGS. 4A-4C are cross-sectional view of split-gate memory cells according to some embodiments of the invention.
Figure 4B:
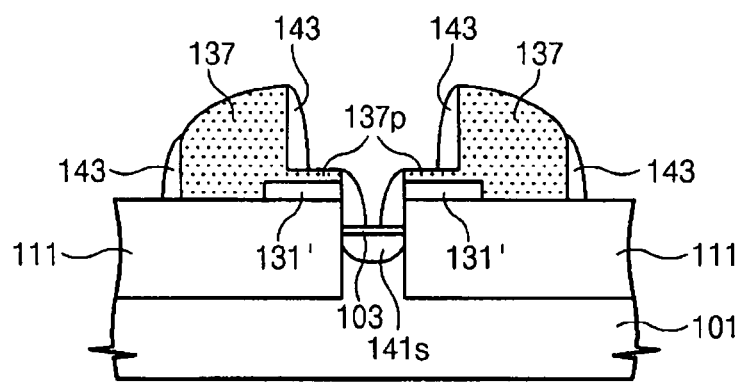
Figure 4C:
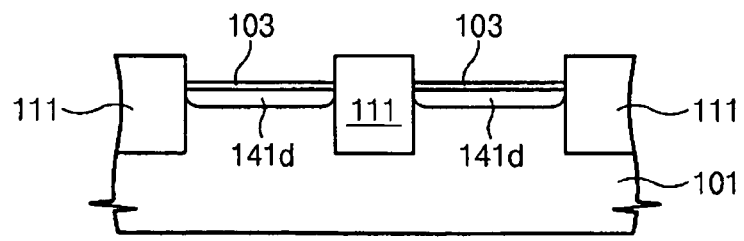

Referring specifically to FIG. 4B, the raised oxide layer 131' is provided by the extension of the oxide layer 131 located on the floating gate 133 onto the field oxide layer 111. Therefore, the raised oxide layer 131' is at a higher level than the oxide layer 131. A central upper portion of the floating gate 133 is lower than the adjacent upper surface of the field oxide region 111. Furthermore, an extension portion 137$p$ of the control gate 137 covers the raised oxide layer 131' that is above the field oxide region 111.

Figure 5:
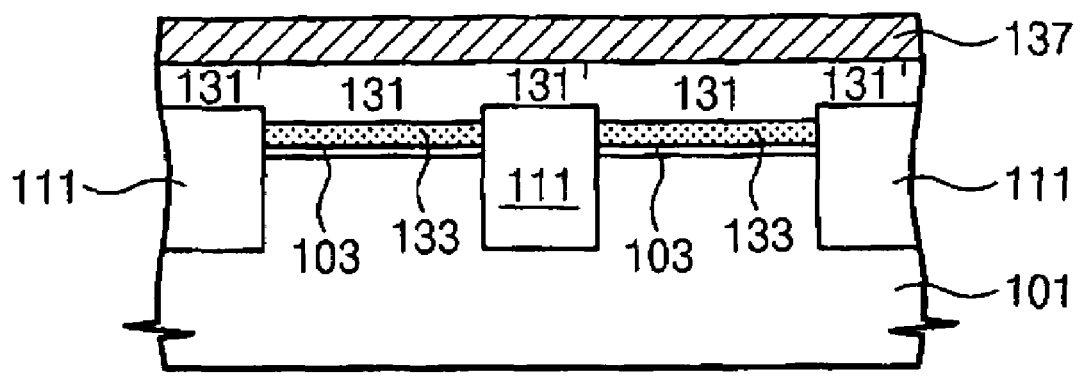
FIG. 5 is a cross-sectional view of split-gate memory cells according to some embodiments of the invention.

Referring specifically to FIG. 5, the floating gates 133 are formed between the field oxide regions 111 and are self-aligned thereto. Furthermore, the oxide layer 131 and the raised oxide layer 131' are formed on the floating gate 133 and on field oxide regions 111 and extend continuously in the x direction. The oxide layer 131 and the raised oxide layer 131' can electrically isolate the floating gates 133 from one another and from the control gate 137 thereon. As shown in FIG. 5, the portion of the oxide layer 131 referred to as the raised oxide layer 131' is thinner than the oxide layer that covers the floating gate 133 (i.e., the oxide layer 131). In some embodiments according to the invention, the oxide layer 131 can be a thermally oxidized polysilicon layer.

FIGS. 6A-C through FIGS. 19A-C are cross-sectional views that illustrate the formation of split-gate non-volatile memory cells according to some embodiments of the invention. In particular, the cross-sections shown in FIGS. 6A-19A are cross-sections taken along line I-I' as shown in FIG. 3. The cross-sections shown in FIGS. 6B-19B correspond to views taken along line II-II'. FIGS. 6C-19C correspond to cross-sections taken along line III-III'.

Figure 6A:
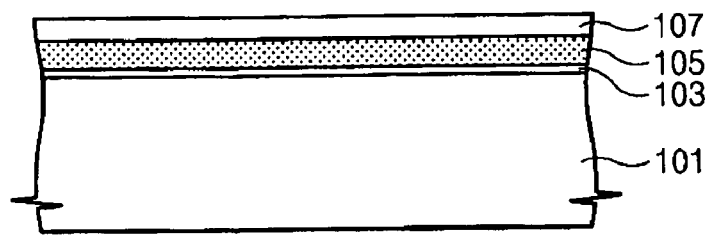
FIGS. 6A-6C through FIGS. 20A-20C are cross-sectional views illustrating the formation of split-gate memory cells according to some embodiments of the invention.
Figure 6B:
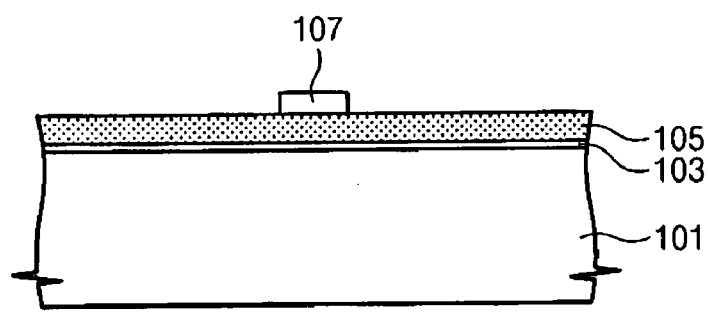
Figure 6C:
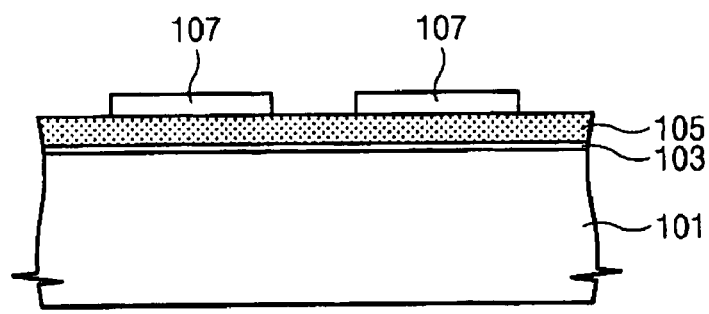

According to FIGS. 6A-C, an insulator layer 103 is formed on a substrate 101. In some embodiments according to the invention, the insulator layer 103 is a thermally grown oxide, such as silicon oxide, formed to a thickness of about 50 Angstroms to about 150 Angstroms. A conductive layer 105 (used to provide the floating gate on the split-gate memory cell) is formed on the insulator layer 103. In some embodiments according to the invention, the first conductive layer 105 is a silicon layer formed to a thickness of about 300 Angstroms to about 1000 Angstroms. A photomask pattern 107 is formed on the first conductive layer 105 so that some portions of the first conductive layer 105 are exposed while others are covered by the photomask pattern 107. In some embodiments according to the invention, photomask pattern 107 is a silicon nitride material.

Figure 7A:
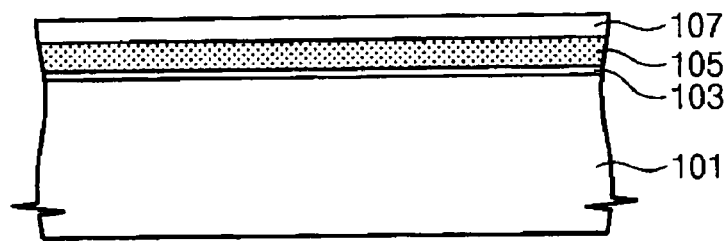
Figure 7B:
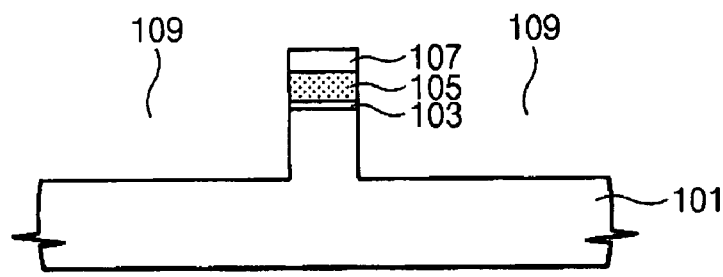
Figure 7C:
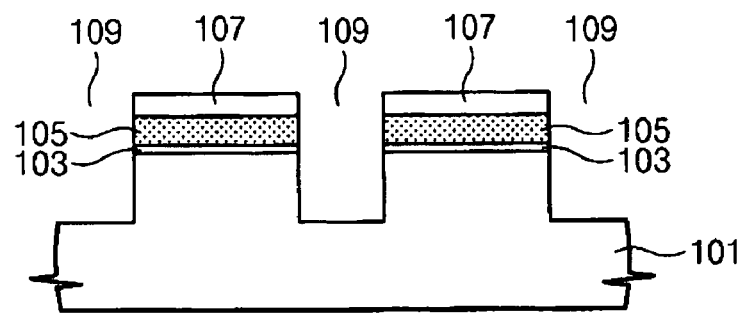
Figure 8A:
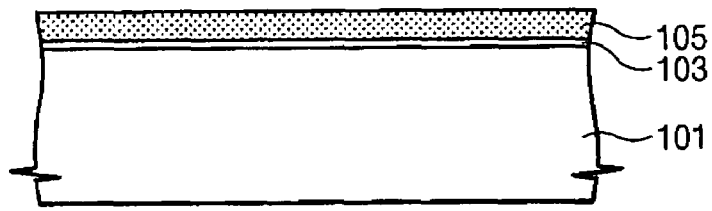
Figure 8B:
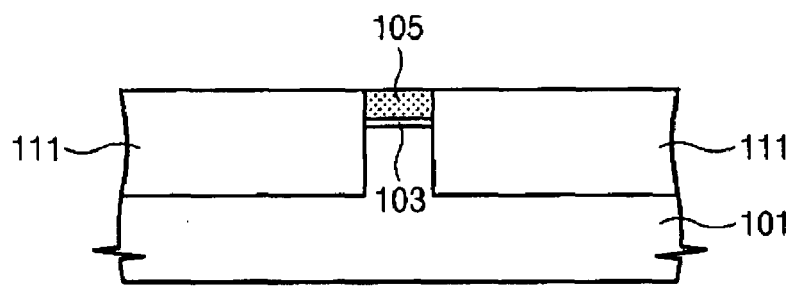
Figure 8C:
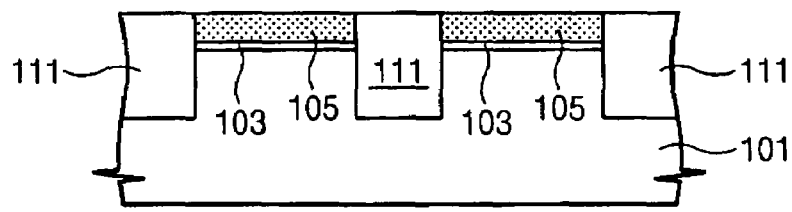

Referring to FIGS. 7A-C, the photomask pattern 107 is used to etch the substrate 101 to form a recess 109 therein. Referring to FIGS. 8A-C, a field oxide material is formed in the trench 109 and on the upper surfaces of the photomask pattern 107. A portion of the field oxide material and the photomask pattern 107 are removed using, for example, chemical mechanical polishing so that the first conductive layer 105 is exposed. Removal of the field oxide material and the photomask pattern 107 also provides for the formation of field oxide regions 111.

According to FIGS. 9A-C, a second conductive layer 113 is formed on the first conductive layer 105 above the portion of the substrate 101 where the floating gate is to be subsequently formed and on the field oxide region 111 adjacent to the floating gate. In some embodiments according to the invention, the second conductive layer 113 is a polysilicon material formed to a thickness less than about 500 Angstroms. An oxidation barrier layer 115 is formed on the second conductive layer 113. In some embodiments according to the invention, the oxidation barrier layer 115 is a silicon nitride layer formed to a thickness of about 500 Angstroms to about 1000 Angstroms.

A first sacrificial layer 117 is formed on the oxidation barrier layer 115. The first sacrificial layer 117 has an etching selectivity relative to the oxidation barrier layer 115. In some embodiments according to the invention, the first sacrificial layer 117 is formed to a thickness of about 2000 Angstroms to about 4000 Angstroms. The first sacrificial layer 117 can be formed using chemical vapor deposition.

Figure 9A:
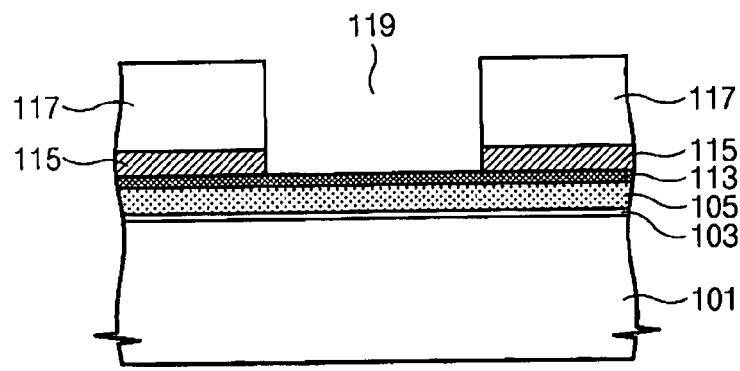
Figure 9B:
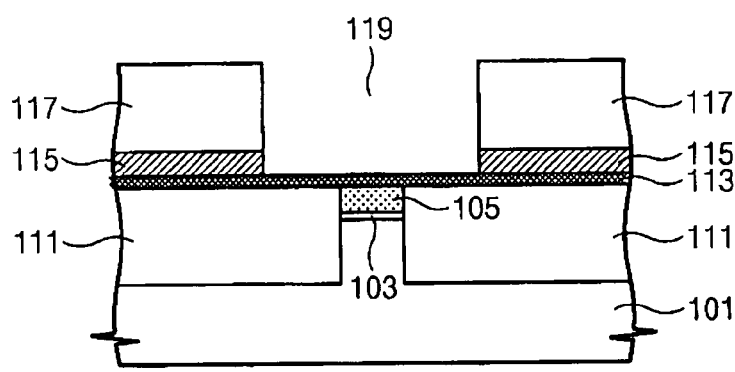
Figure 9C:
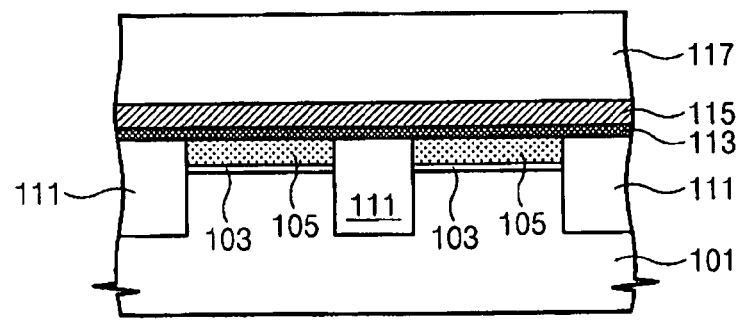

The first sacrificial layer 117 and the oxidation barrier layer 115 are etched to form a recess 119 that exposes the second conductive layer 113 on the active region of the substrate (i.e., where the floating gate is to be formed) as well as on the field oxide region 111 as shown in FIGS. 9A and B respectively.

Figure 10A:
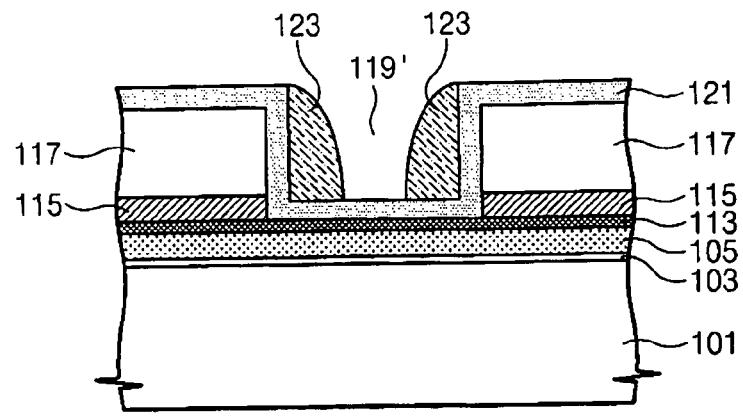
Figure 10B:
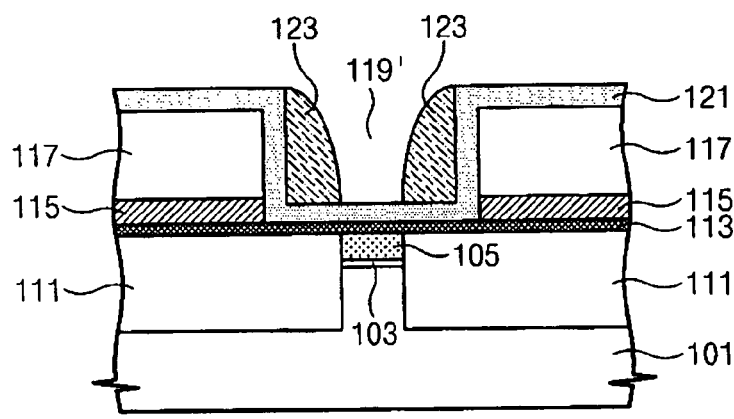
Figure 10C:
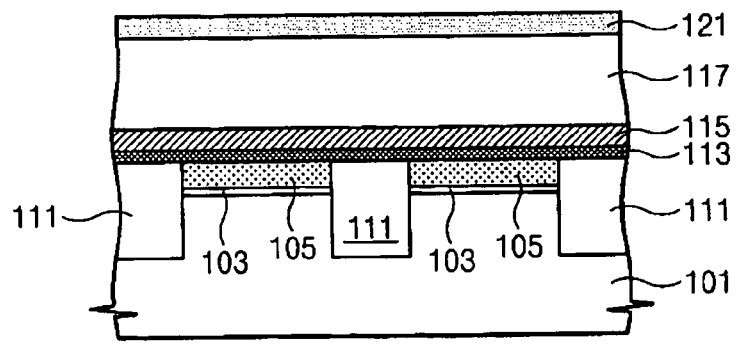

Referring to FIGS. 10A-C, a second sacrificial layer 121 is formed in the recess 119 including at the bottom of the recess 119 on the second conductive layer 113 to form a secondary recess 119'. In some embodiments according to the invention, the second sacrificial layer 121 is an oxide formed using chemical vapor deposition to a thickness of about 200 Angstroms to about 500 Angstroms.

A spacer material is deposited on the second sacrificial layer 121 inside the recess 119' and outside the recess 119'. In some embodiments according to the invention, the spacer material is deposited to a thickness of about 1000 Angstroms to about 2000 Angstroms and is a material that has an etching selectivity relative to the second sacrificial layer 121, such as silicon nitride. The spacer material formed in the recess 119' and outside the recess 119' is etched-back to form inner spacer 123 inside the recess 119' and to expose the second sacrificial layer 121 at a central portion of the bottom of the recess 119'.

Figure 11A:
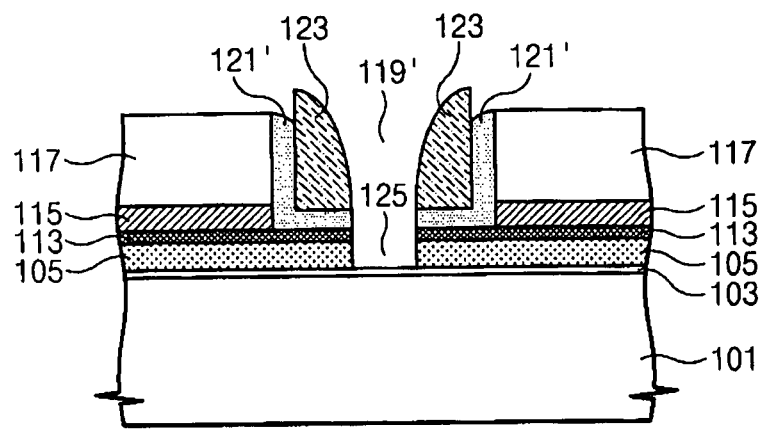
Figure 11B:
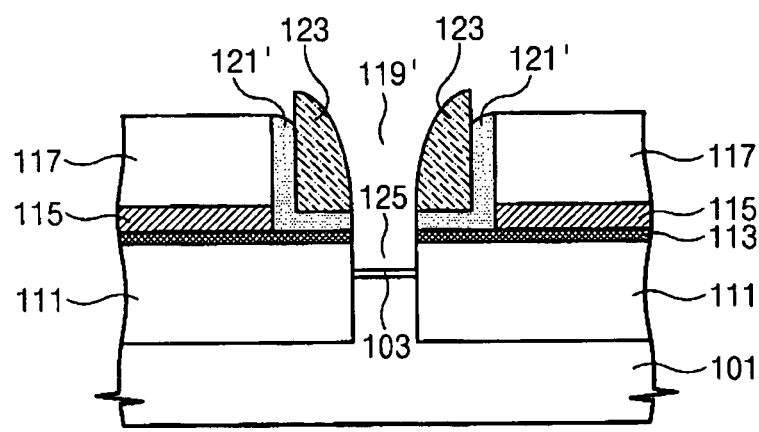
Figure 11C:
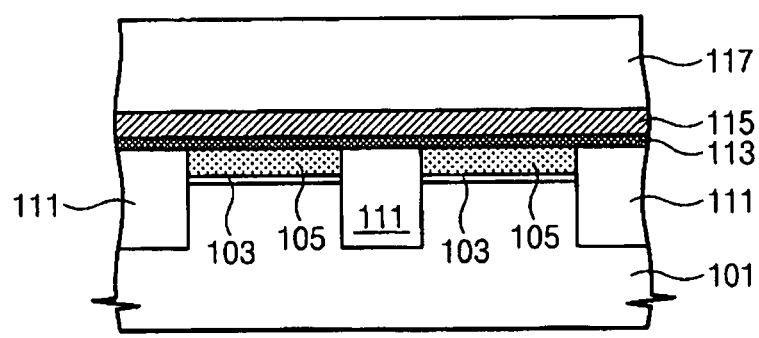

Referring to FIGS. 11A-C, the etch-back of the inner spacer material continues to expose the upper surface of the first sacrificial layer 117 and the second sacrificial layer 121 between the first sacrificial layer 117 and a sidewall of the inner spacer 123 so that upper sidewall of the inner spacer 123 is exposed above the first and second sacrificial layers 117 and 121. The recess 119' is further etched to remove the exposed portion of the second sacrificial layer 121 at a bottom of the recess 119' and the underlying portions of the first and second conductive layers 105 and 113. As shown in FIG. 11B, the further etching in the recess 119' removes the underlying portion of the second conductive layer 113 above the field oxide region 111 and can provide access to the substrate 101 for formation of the common source region shared by the opposing split-gate non-volatile memory cells.

Figure 12A:
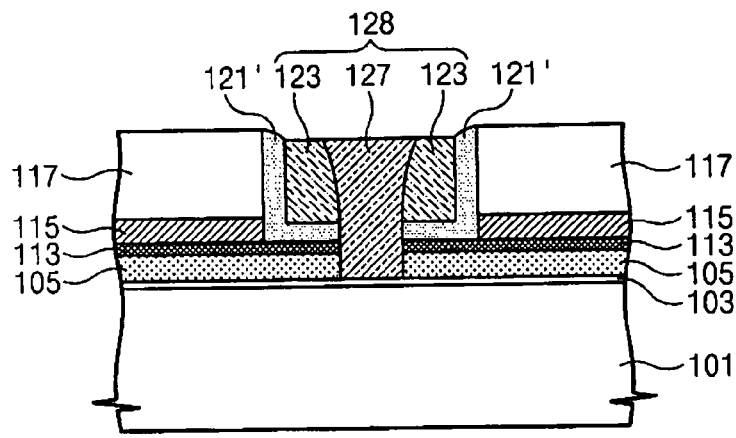
Figure 12B:
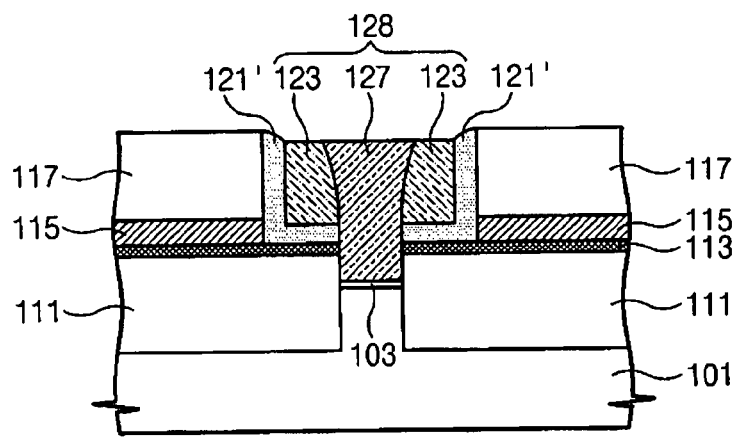
Figure 12C:
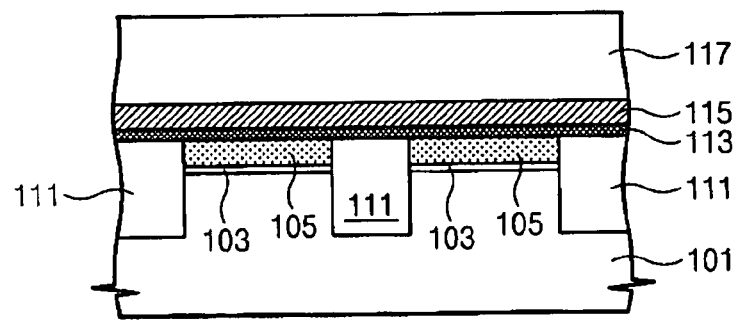

According to FIGS. 12A-C, a silicon nitride blanket layer is deposited in the recess 119' and on the upper surfaces of the first and second sacrificial layers 117 and 121. The silicon nitride blanket layer is planarized to expose the first sacrificial layer 117 to form a T-shaped sacrificial structure 128 including the inner spacer 123 and a center pillar 127.

Figure 13A:
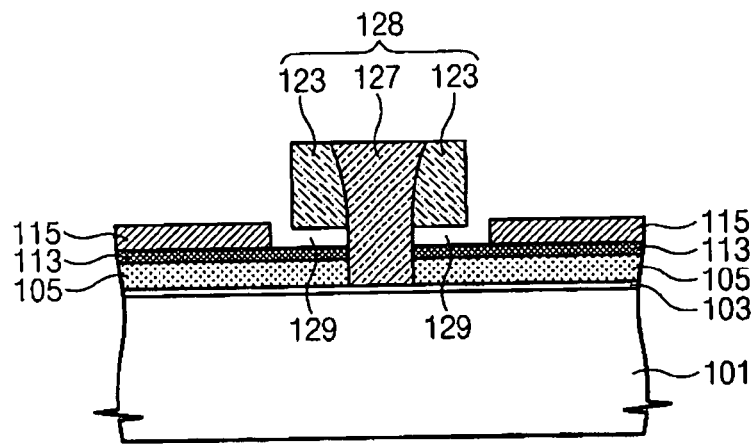
Figure 13B:
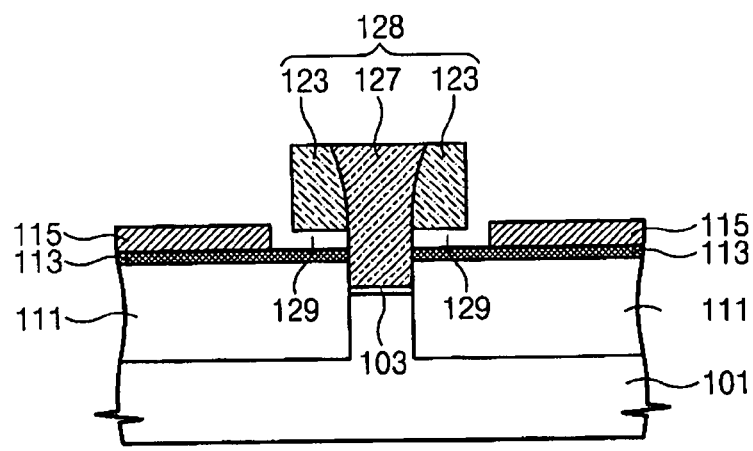
Figure 13C:
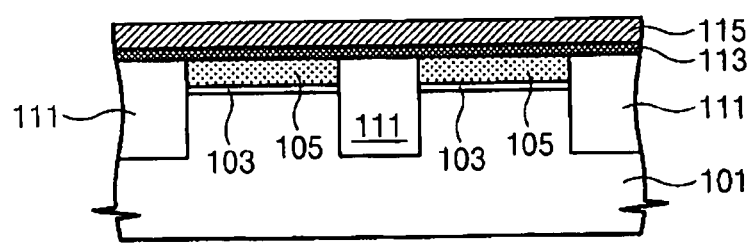

According to FIGS. 13A-C, an etching process is used to remove the second sacrificial layer 121' from around the sacrificial structure 128 to form a first gap above the active region (where a subsequent floating gate is to be formed) and a second gap above the field oxide region 111. As shown in FIG. 13A, the first gap exposes a portion of the second conductive layer 113, the first gap being defined by the sacrificial structure 128 above and the second conductive layer 113 below. As shown in FIG. 13B, the second gap exposes the second conductive layer 113 on the field oxide region 111, wherein the second gap is defined by the sacrificial structure 128 above and the second conductive layer 113 below.

Figure 14A:
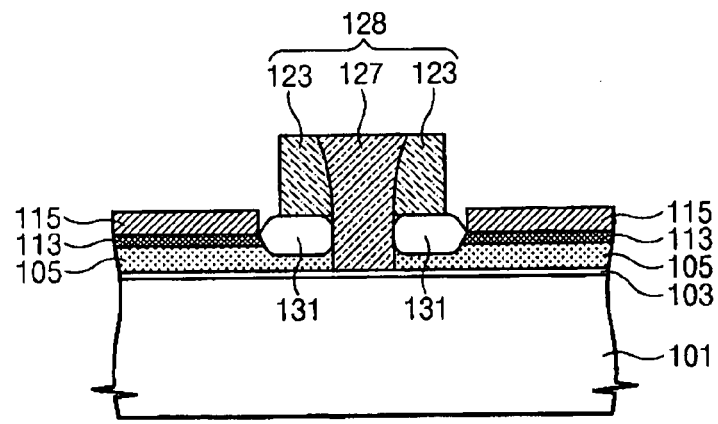
Figure 14B:
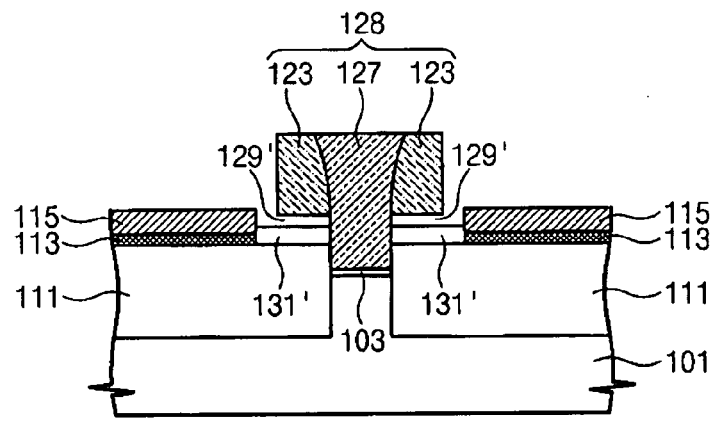
Figure 14C:
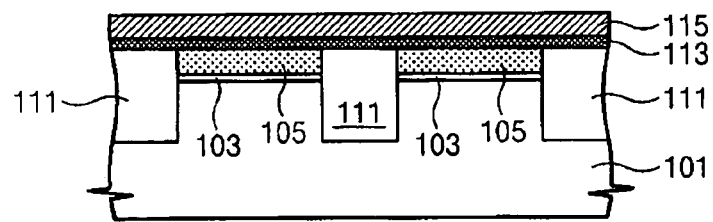

According to FIGS. 14A-C, an oxidation process is performed to provide an oxide layer on the active regions between the opposing split-gate non-volatile memory cells and extending onto the adjacent field oxide regions 111 to form a raised oxide layer 131'. As shown in FIG. 14A, the full thickness of the second conductive layer 113 is oxidized in addition to a partial thickness of the first conductive layer 105 being oxidized to fill the first gap beneath the sacrificial structure 128. As shown in FIG. 14B, the oxidation process fully oxidizes the second conductive layer 113 in the second gap to provide the raised oxide layer 131' and to leave a remaining gap portion 129' above the raised oxide layer 131' and below the sacrificial structure 128 on the field oxide region 111.

Figure 15A:
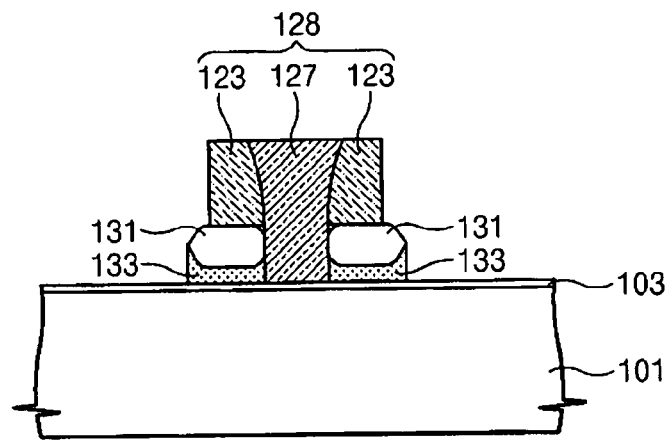
Figure 15B:
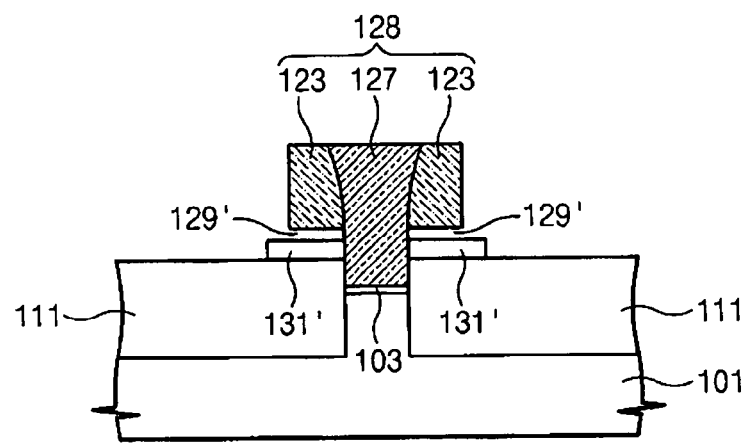
Figure 15C:
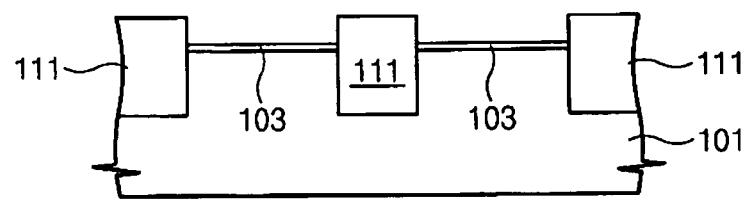

According to FIGS. 15A-C, the oxidation barrier layer 115 and the underlying second conductive layer 113 are removed from the substrate 101. Furthermore, a portion of the first conductive layer 105 is also removed from the substrate 101 while a portion of the first conductive layer 105 underlying the oxide layer 131 above the active regions remains. In some embodiments according to the invention, the oxide layer 131 is used as an etch mask to remove the oxidation barrier layer 115, the second conductive layer 113, and the portion of the first conductive layer 105 as described above. Accordingly, the etching process is used to form floating gates 133 that are self-aligned to the field oxide region 111 and to the oxide layers 131. As shown in FIG. 15B, the formation of the floating gate 133 is avoided on the field oxide region 111 due to the presence of the raised oxide layer 131' and the absence of the first conductive layer 105 therefrom.

Figure 16A:
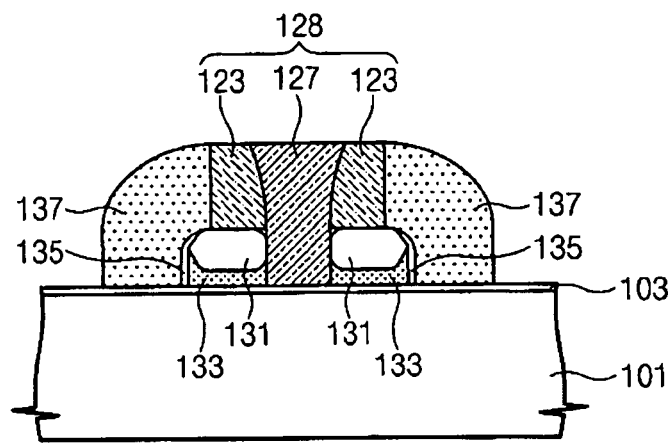
Figure 16B:
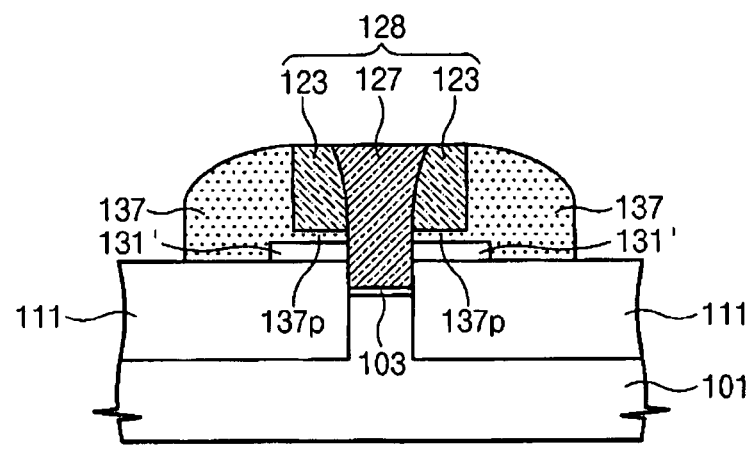
Figure 16C:
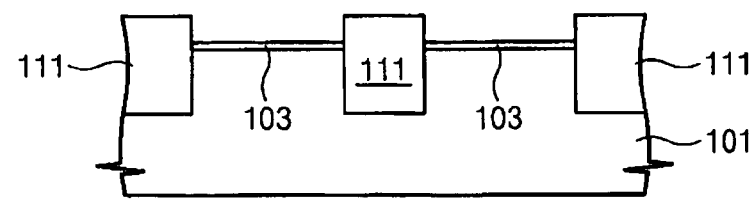

In some embodiments according to the invention, sacrificial spacers 132 can be formed on sidewalls of the sacrificial structure 128 prior to removal of the second conductive layer 113 and the portion of the first conductive layer 105 not covered by the oxide layer 131. As shown in FIG. 16B, the sacrificial spacer 132 extends between the sacrificial structure 128 and the raised oxide layer 131 to fill the remaining gap portion 129' left unfilled during formation of the raised oxide layer 131'. In some embodiments according to the invention, the sacrificial spacer 132 is formed of a silicon nitride material. It will be understood that the sacrificial spacer 132 can be used to protect against over etching of the oxide layer 131. Furthermore, the amount of overlap of the sacrificial spacer 132 onto an upper surface of the sacrificial structure 128 can be adjusted to control how much the control gate overlaps the floating gate 133.

Figure 17A:
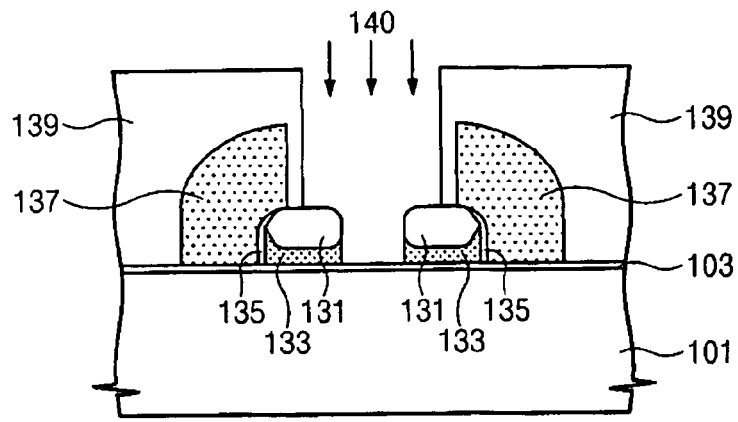
Figure 17B:
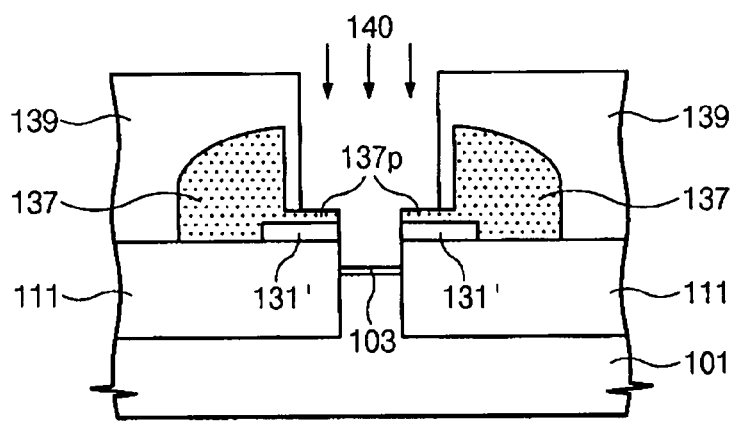
Figure 17C:
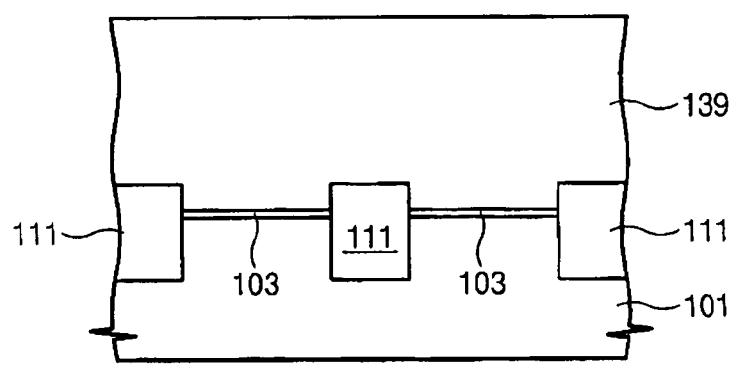

According to FIGS. 17A-C, a spacer 135 is formed on sidewalls of the floating gate 133 and the oxide layer 131. In some embodiments according to the invention, the spacers 135 are formed using a thermal oxidation process or thin film deposition process. A conductive layer is deposited on the structure including on the spacer 135 and sidewall of the sacrificial structure 128. The conductive material is etched back to form the control gate 137 that extends vertically adjacent to the sidewall of the floating gate 133 and the sidewall of the oxide layer 131 above the active regions in the substrate 101. Furthermore, the control gate 137 extends to cover a portion of the oxide layer 131 as shown in FIG. 17A.

As shown in FIG. 17B, the control gate 137 includes an extended portion 137p that extends between a bottom of the sacrificial structure 128 and an upper surface of the raised oxide layer 131' to fill the remaining gap portion 129' left unfilled during oxidation to form the raised oxide layer 131'.

Figure 18A:
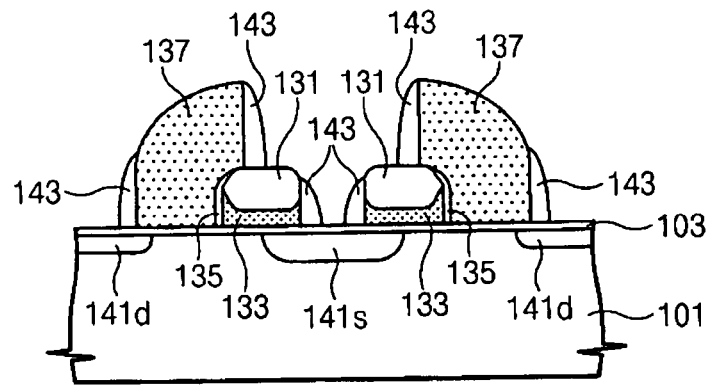
Figure 18B:
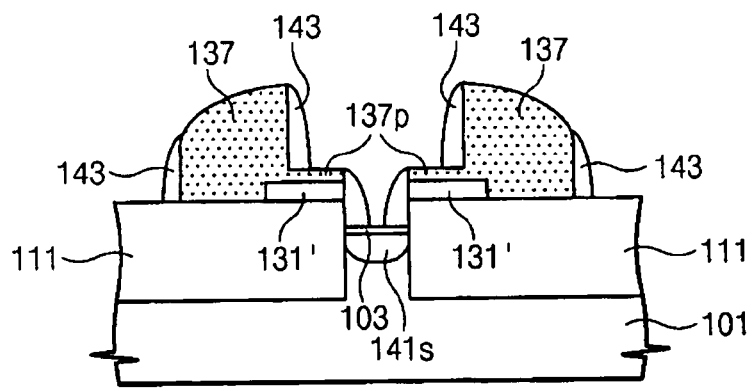
Figure 18C:
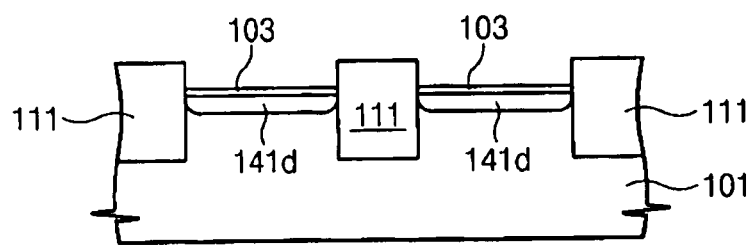

According to FIGS. 18A-C, the sacrificial structure 128 is removed and a mask pattern 139 is formed on the structure. An ion implantation 140 is performed through openings in the mask pattern 139 to form a common source region 141s in the substrate 101.

Figure 19A:
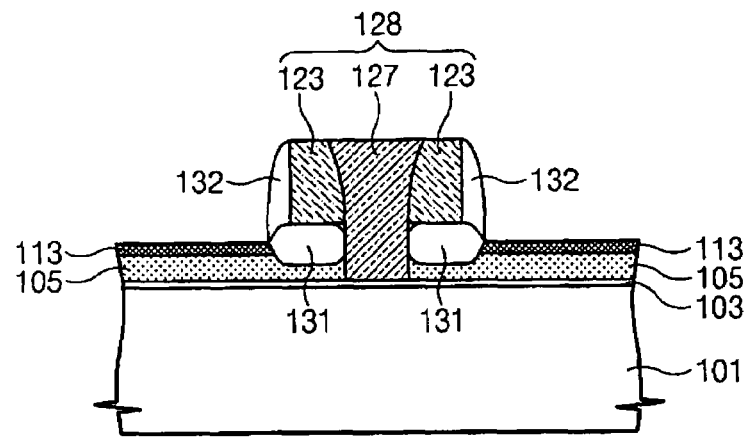
Figure 19B:
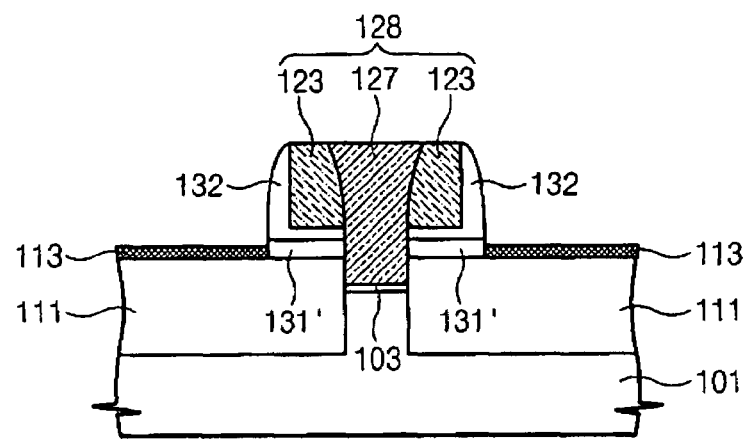
Figure 19C:
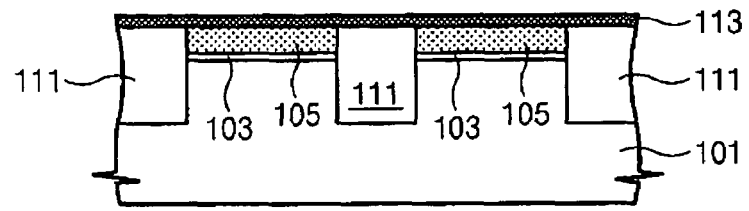

According to FIGS. 19A-C, the common source region 141s is out-diffused using, for example, an annealing process. A spacer 143 is formed on a sidewall of the control gate 137 above the floating gates 133 and on the sidewalls of the raised oxide layer 131' and the floating gate 133. In some embodiments according to the invention, the spacer 143 is formed by depositing a blanket layer of silicon nitride of a thickness of about 500 Angstroms to about 1000 Angstroms which is etched back so that the spacers 143 remain on the structure. A subsequent implant is performed (not shown) to form respective drain regions 141d in the substrate 101 associated with the opposing split-gate non-volatile memory cells. Also, additional backend processing steps can be provided to complete the split-gate non-volatile-memory cells, such as formation of interlayer dielectric layers and metal wiring layers which can contact for example, the common source region 141s.

Figure 20A:
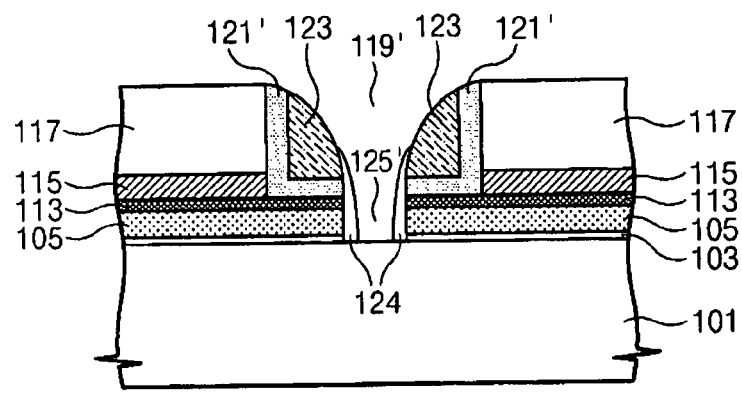
Figure 20B:
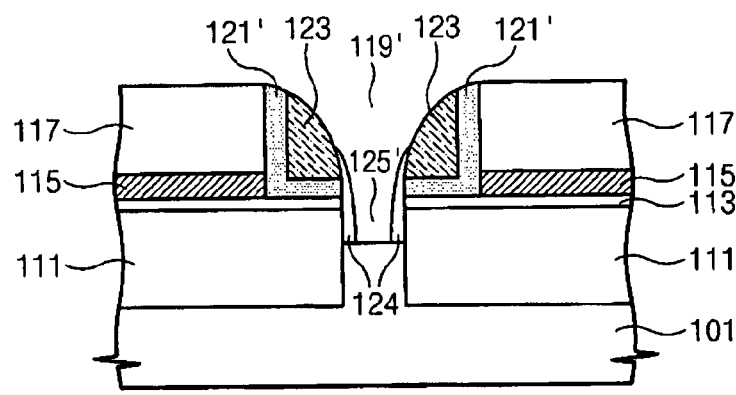
Figure 20C:
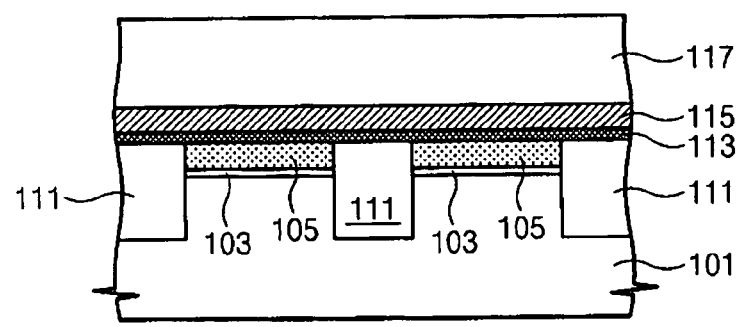

FIGS. 20A-C through FIGS. 21A-C are cross-sectional views, taken along lines I-I', II-II', and III-III' respectively in FIG. 3, that illustrate the formation of split-gate memory cells according to some embodiments of the invention. Referring to FIGS. 20A-C, the structures described above in reference to FIGS. 6A-C through FIGS. 10A-C can be formed as a basis for further embodiments described herein with reference to FIGS. 20A-C through FIGS. 21A-C. In particular, as shown in FIGS. 20A-C, the recess 119' is subject to further etching to remove the underlying portions of the second sacrificial layer 121' and underlying portions of the first and second conductive layers 105 and 113 to expose a portion of the substrate 101 to form further recess 125'. A spacer is formed on a sidewall of the further recess 125' that is defined by the first and second conductive layers 105 and 113. The spacer 124 can electrically isolate the first and second conductive layers 105 and 113 from a contact to be subsequently formed in the recess 119' and further recess 125'.

Figure 21A:
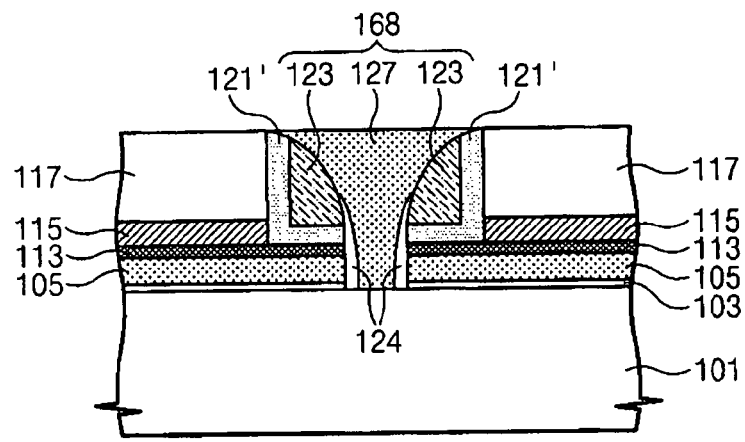
Figure 21B:
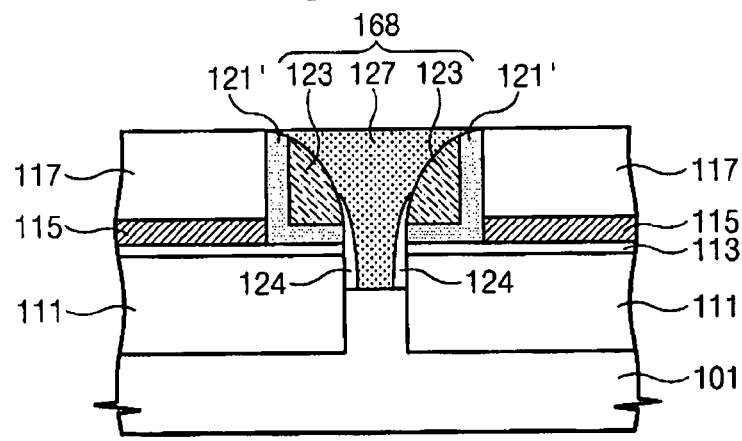
Figure 21C:
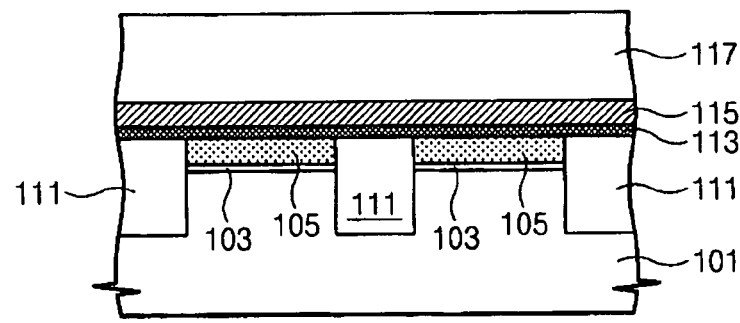

According to FIGS. 21A-C, a conductive material 127 is formed in the recess 119' and the further recess 125' including on the spacer 124. The conductive material is deposited outside the recess 119' and on an upper surface of the first sacrificial layer 117. A planarization process is used (such as chemical mechanical planarization) to remove portions of the conductive material 127 outside the recess 119' to provide a contact structure 168 to electrically coupled to a subsequently formed common source region in the substrate below. Furthermore, subsequent processing steps can be used as outlined above in reference to FIGS. 13A-C through FIGS. 19A-C to complete the split-gate memory cells according to some embodiments of the invention.

FIGS. 22A-C through FIGS. 27A-C are cross-sectional views, taken along lines I-I', II-II', and III-III' respectively in FIG. 3, that illustrate the formation of split-gate non-volatile memory cells according to some embodiments of the invention. In particular, FIGS. 22A-C through FIGS. 27A-C illustrate method embodiments according to the invention where a single conductive layer is formed rather than the two conductive layers as described above in reference to FIGS. 4-21.

Figure 22A:
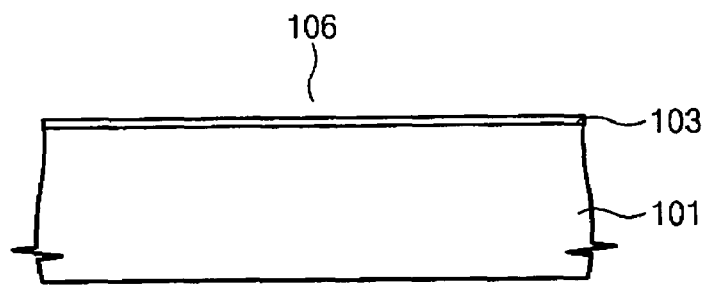
FIGS. 22A-22C through FIGS. 27A-27C are cross-sectional views illustrating the formation of split-gate memory cells according to further embodiments of the invention.
Figure 22B:
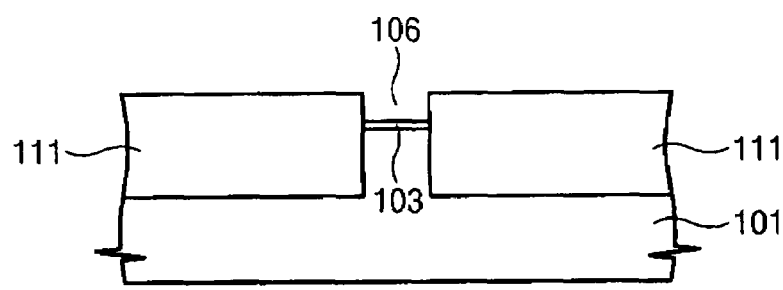
Figure 22C:
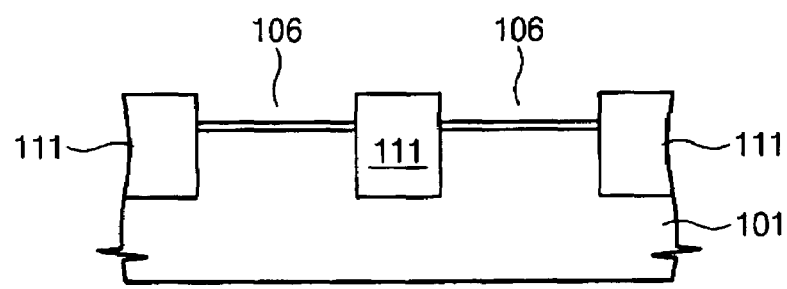

Referring to FIGS. 22A-C, an insulator layer 103 is formed on the substrate 101 and a silicon nitride layer (not shown) is formed on the insulator layer 103. A mask pattern is formed on the silicon nitride layer including openings therein so that the underlying layers including the silicon nitride, the insulator layer 103 and the substrate 101 can be patterned.

Portions of the silicon nitride layer, the insulator layer 103 and the substrate 101 are etched using the mask pattern. The mask pattern is removed and a field oxide material is deposited on the substrate and is planarized to provide field oxide regions 111 adjacent to active regions on which opposing split-gate memory cells are to be formed. As shown in FIGS. 22A and B, field oxide region 111 is raised relative to the insulator layer 103 on the area of the substrate 101 where the active regions are to be formed (i.e., as shown in FIG. 22A).

Figure 23A:
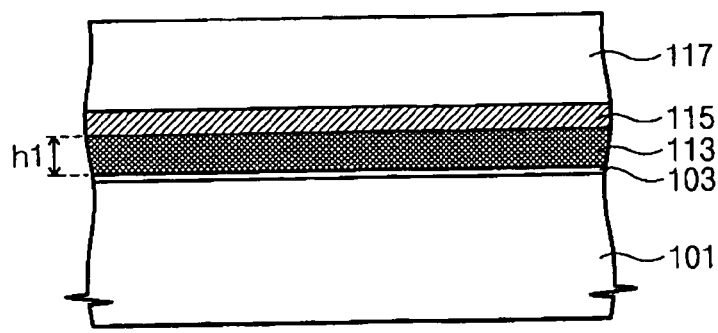
Figure 23B:
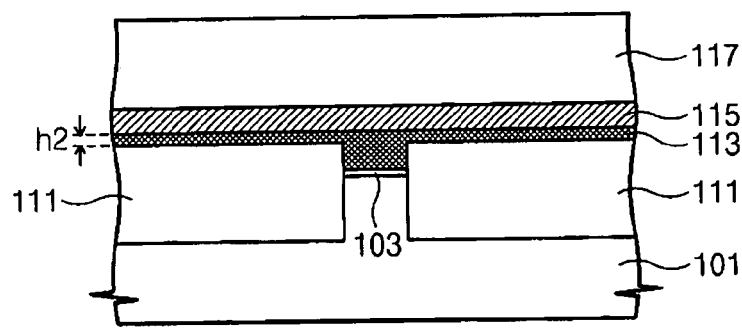
Figure 23C:
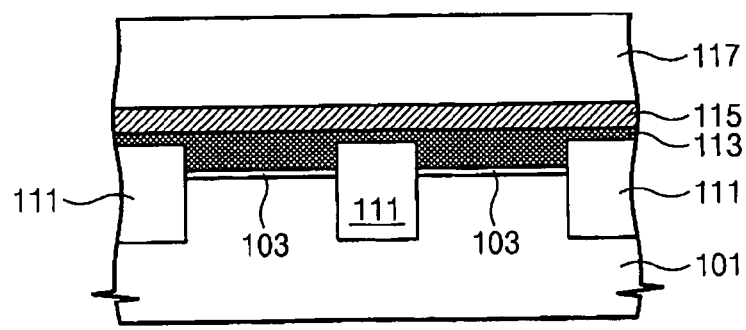

According to FIGS. 23A-C, a conductive layer 113 is deposited on the insulator layer 103 and the field oxide regions 111 and is planarized. As shown in FIGS. 23A and B, the thickness of the conductive layer 113 on the active regions is greater than the thickness of the conductive layer 113 on the field oxide region 111. In some embodiments according to the invention, the conductive layer 113 is a silicon layer.

Figure 24A:
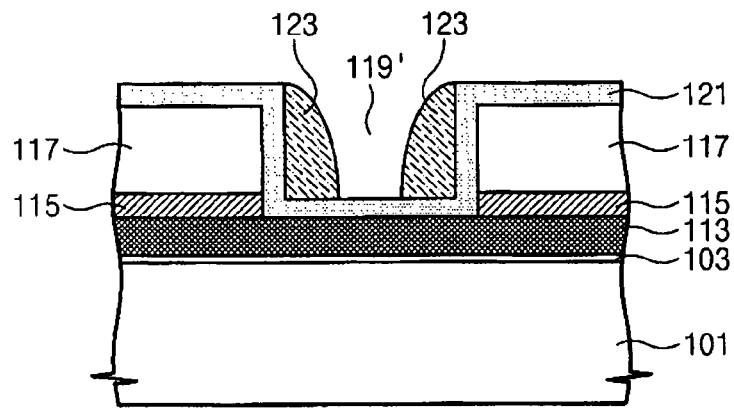
Figure 24B:
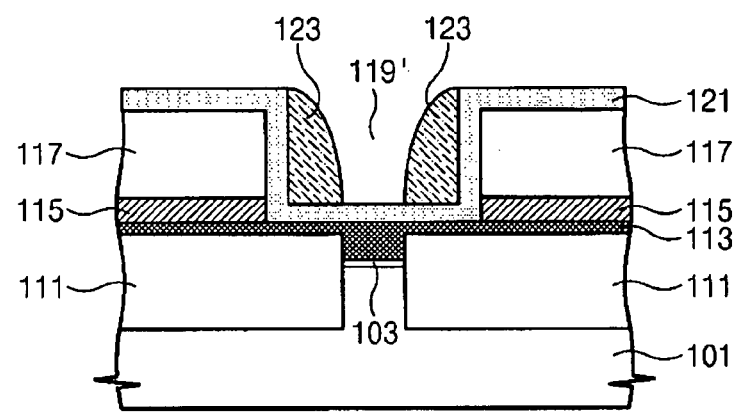
Figure 24C:
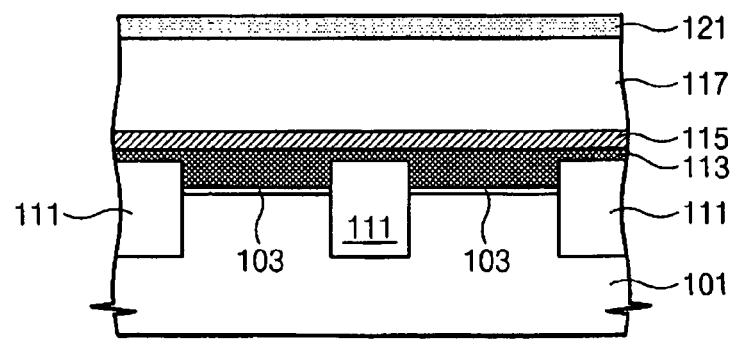

According to FIGS. 24A-C, an oxidation barrier layer 115 is formed on the conductive layer 113 followed by formation of the first sacrificial 117. The first sacrificial layer 117 and the oxidation barrier layer 115 are etched to form the recess 119'. The second sacrificial layer 121 is formed in the recess 119' and outside the recess 119' on an upper surface of the first sacrificial layer 117. Furthermore, an inner spacer material is formed on an upper surface of the second sacrificial layer 121 outside the recess 119' and inside the recess 119'. The inner spacer material is etched back so that an inner spacer 123 is formed on the sidewall of the recess 119'. As shown in FIGS. 24A and B, the inner spacer 123 leaves a central portion of the recess 119' uncovered so that a portion of the second sacrificial layer 121 is exposed after formation of the inner spacer 123.

Figure 25A:
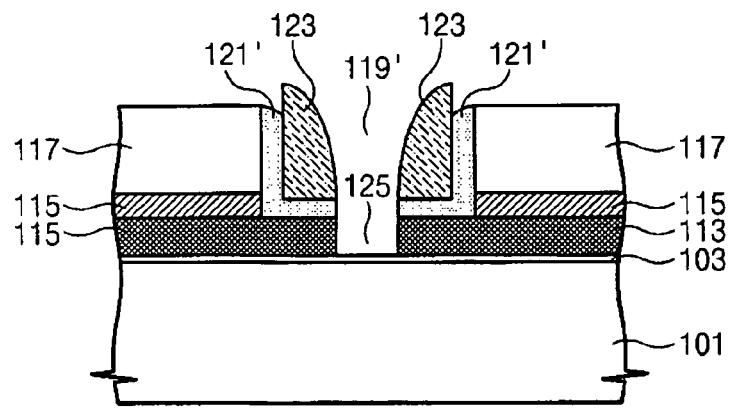
Figure 25B:
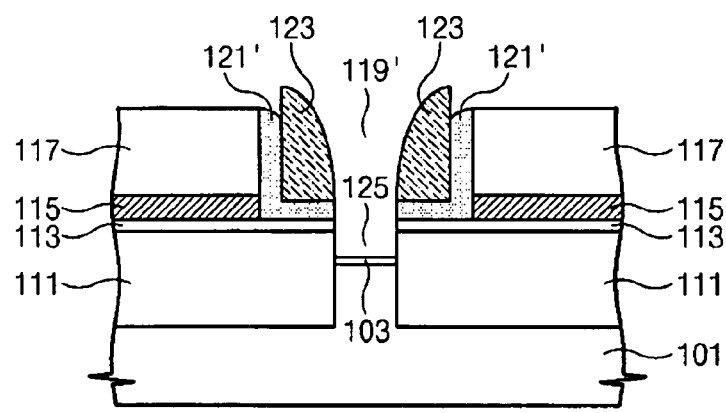
Figure 25C:
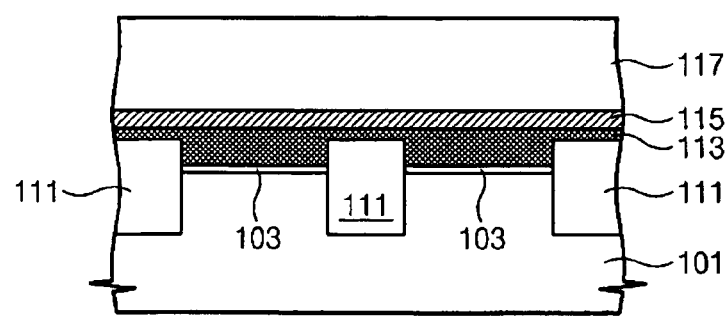

According to FIGS. 25A-C, the etch back continues so that the first sacrificial layer 117 and second sacrificial layer 121' thereunder are exposed. Furthermore, a further recess 125 is formed below the recess 119' when removing portions of the second sacrificial layer 121' and conductive layer 113 underlying exposed portion of the sacrificial layer 121 in the recess 119'.

Figure 26A:
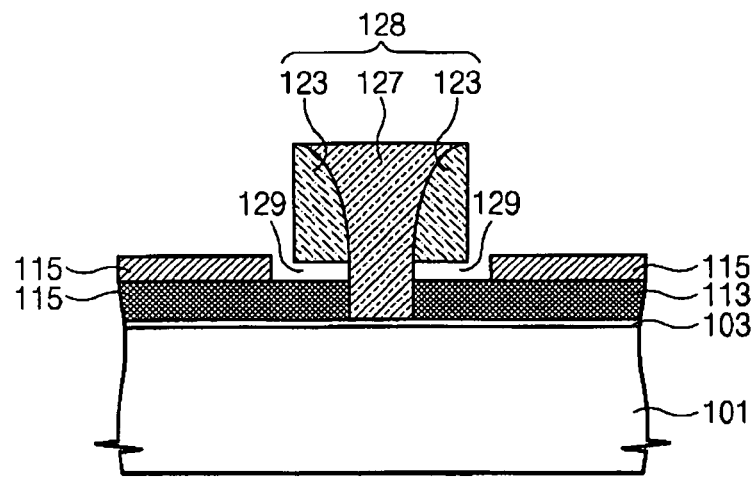
Figure 26B:
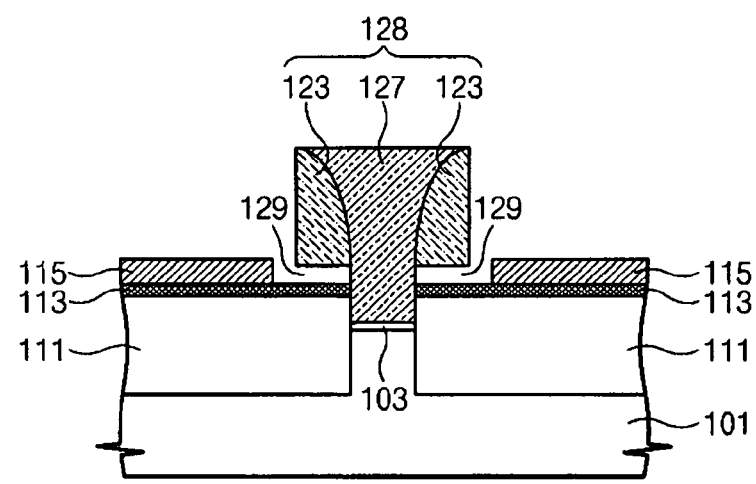
Figure 26C:
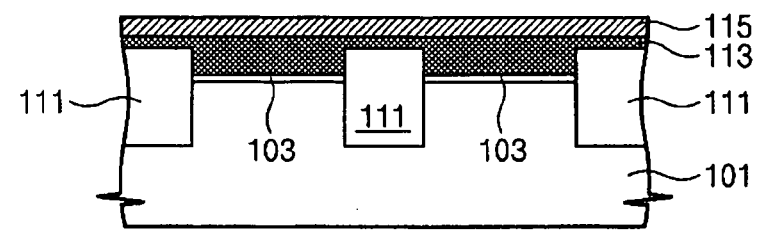

According to FIGS. 26A-C, a center pillar 127 is formed in the recess 119' and further recess 125 to form a T-shaped sacrificial structure 128. Furthermore, the second sacrificial layer 121' is removed from around the sacrificial structure 128 to provide first and second gaps between the lower surface of the sacrificial structure 128 and an upper surface of the first conductive layer 113 on both the active region and the field oxide region 111.

Figure 27A:
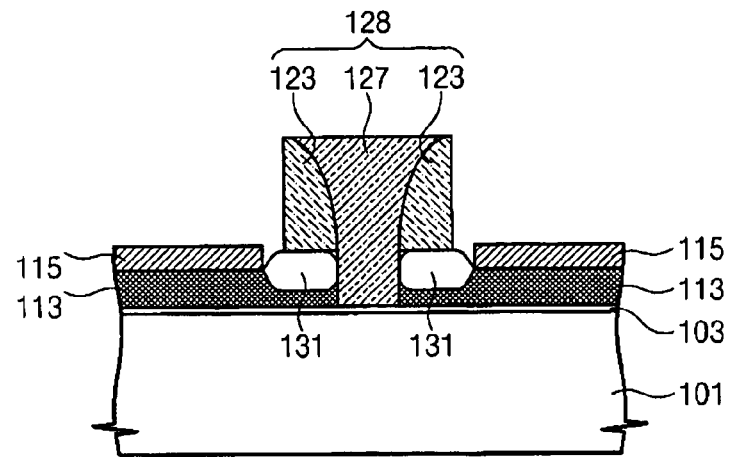
Figure 27B:
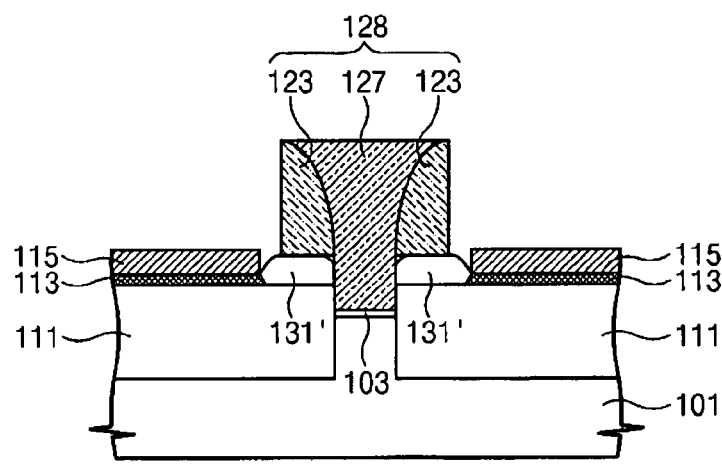
Figure 27C:
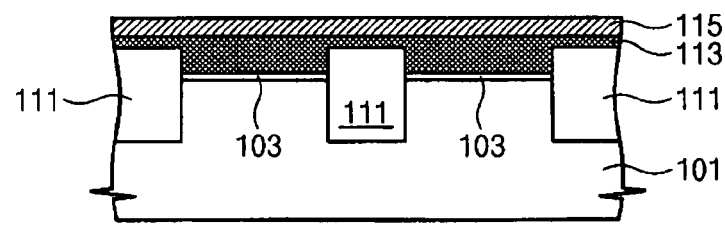

According to FIGS. 27A-C, a partial thickness of the conductive layer 113 on the portion of the substrate in which the active regions are to be formed is oxidized to provide the formation of the oxide layer 131. As shown in FIG. 27A, a full thickness of the conductive layer 113 is oxidized to form the raised oxide layer 131' on the field oxide regions 111. As shown in FIGS. 27A and B, the oxidation of the conductive layer 113 fills both the first and second gaps.

Further backend processing steps can be provided as discussed above in reference to FIGS. 15A-C through FIGS. 19A-C. Furthermore, the embodiments described above in reference to FIGS. 22A-C through FIGS. 27A-C can be combined with aspects described above in reference to FIGS. 20A-C through FIGS. 21A-C.

As described above, in some embodiments according to the invention, an oxide layer can be formed to cover first and second adjacent floating gates and a field oxide region, wherein the oxide layer electrically isolates the first and second adjacent floating gates from one another. For example, the oxide layer can extend from on the active region above the floating gate onto the adjacent field oxide region. Furthermore, the portion of the oxide layer that extends onto the field oxide region can be raised relative to the oxide layer that is above the floating gate.

Accordingly, a surface of the raised oxide layer is at a higher level than a surface of the oxide layer located above the floating gate. Extending the oxide layer from on the floating gate to on the field oxide region (and further onto the floating gate in the adjacent memory cell) can electrically isolate the floating gates in the adjacent memory cells from one another. Furthermore, the floating gates can be formed self-aligned to the field oxide regions (and isolated from one another via the oxide layer including the raised oxide layer on the field oxide between adjacent split-gate memory cells). The oxide layer including the raised oxide layer on the field oxide region may improve the self-alignment of the floating gates in forming the split-gate memory cells according to some embodiments of the invention.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims.

The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of forming a split-gate non-volatile memory cell comprising:
   forming first and second adjacent floating gates self-aligned to a field oxide region therebetween;
   forming an oxide layer covering the first and second adjacent floating gates and the field oxide region, the oxide layer electrically isolating the first and second adjacent floating gates from one another; and
   forming a control gate on the oxide layer on the first and second adjacent floating gates wherein forming first and second adjacent floating gates comprises forming a conductive layer on respective active regions in a substrate adjacent to the field oxide region and avoiding forming the conductive layer on the field oxide region, wherein the conductive layer comprises a first conductive layer, the method further comprising:
   forming a second conductive layer on the first conductive layer and on the field oxide region.

2. A method according to claim 1 wherein the split-gate non-volatile memory cell is included in a common source/drain configuration with another split-gate non-volatile memory cell, the method further comprising:
   forming a recess to provide access to the substrate between the split-gate non-volatile memory cells for doping of the substrate to form a common source/drain region in the substrate; and
   forming a spacer on a sidewall of the recess defined by portions of the first and second conductive layers to electrically isolate the first and second conductive layers from a contact formed in the recess on the spacer.

3. A method according to claim 1 wherein forming an oxide layer comprises:
   oxidizing the second conductive layer on the first conductive layer; and
   oxidizing the second conductive layer on the field oxide region.

4. A method according to claim 3 wherein oxidizing the second conductive layer on the first conductive layer comprises:
   oxidizing a portion of the second conductive layer on the first conductive layer exposed in a gap defined by a sacrificial structure above the portion and by the first conductive layer below the portion.

5. A method according to claim 4 wherein oxidizing comprises oxidizing a full thickness of the portion of the second conductive layer and a partial thickness of a portion of the first conductive layer to form the oxide layer on the first conductive layer that fills the gap.

6. A method according to claim 5 further comprising:
   forming a sacrificial spacer on a side wall of the sacrificial structure, above the active regions, that covers an exposed portion of the oxide layer in the gap.

7. A method according to claim 3 wherein oxidizing the second conductive layer on the field oxide region comprises:
   oxidizing a portion of the second conductive layer on the field oxide region exposed in a gap defined by a sacrificial structure above the portion and by the field oxide region below the portion.

8. A method according to claim 7 further comprising:
forming a sacrificial spacer on a side wall of the sacrificial structure, above the field oxide region, that covers an exposed portion of the extended oxide layer that fills the gap.

9. A method according to claim 7 wherein oxidizing comprises oxidizing a full thickness of the portion of the second conductive layer to form an extended oxide layer on the field oxide region extending onto the first and second active regions, the extended oxide layer on the field oxide region partially filling the gap.

10. A method according to claim 9 wherein the extended oxide layer includes a raised surface that is higher than a surface of the oxidized second conductive layer on the first conductive layer.

11. A method according to 9 wherein forming a control gate on the oxide layer further comprises:
forming an extended control gate portion of the control gate in the gap on the extended oxide layer.

12. A method according to claim 1 further comprising:
oxidizing the conductive layer on the active region; and
oxidizing the conductive layer on the field oxide region.

13. A method according to claim 1 wherein the conductive layer comprises polysilicon.

* * * * *